United States Patent
Nakamura et al.

(10) Patent No.: US 6,864,820 B2
(45) Date of Patent: Mar. 8, 2005

(54) ANALOG-TO-DIGITAL CONVERSION USING AN INCREASED INPUT RANGE

(75) Inventors: Katsufumi Nakamura, Andover, MA (US); Steven Decker, Derry, NH (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/376,515

(22) Filed: Feb. 28, 2003

(65) Prior Publication Data

US 2003/0184464 A1 Oct. 2, 2003

Related U.S. Application Data

(60) Provisional application No. 60/360,499, filed on Feb. 28, 2002.

(51) Int. Cl.[7] .................................................. H03M 1/12
(52) U.S. Cl. ....................................... 341/155; 341/161
(58) Field of Search .............................. 341/155, 120, 341/118, 161

(56) References Cited

U.S. PATENT DOCUMENTS

| | | | |
|---|---|---|---|
| 4,562,456 A | 12/1985 | Bolger | 348/572 |
| 4,706,767 A | 11/1987 | Chou | 362/544 |
| 4,814,767 A * | 3/1989 | Fernandes et al. | 341/158 |
| 4,999,628 A * | 3/1991 | Kakubo et al. | 341/139 |
| 5,043,732 A | 8/1991 | Robertson et al. | 341/156 |
| 5,053,771 A | 10/1991 | McDermott | 341/156 |
| 5,184,130 A * | 2/1993 | Mangelsdorf | 341/156 |
| 5,387,914 A * | 2/1995 | Mangelsdorf | 341/156 |
| 5,412,385 A * | 5/1995 | Mangelsdorf | 341/120 |
| 5,867,116 A * | 2/1999 | Nakamura et al. | 341/159 |
| 5,874,909 A * | 2/1999 | Soenen et al. | 341/141 |
| 5,929,799 A | 7/1999 | Rothenberg | 341/156 |
| 6,252,536 B1 * | 6/2001 | Johnson et al. | 341/155 |
| 6,323,792 B1 | 11/2001 | Regier | 341/118 |
| 6,498,577 B1 * | 12/2002 | Lin | 341/156 |

* cited by examiner

*Primary Examiner*—Peguy JeanPierre
(74) *Attorney, Agent, or Firm*—Wolf, Greenfield & Sacks, PC

(57) ABSTRACT

One embodiment of the invention is directed to a method of extending the input range of an analog-to-digital converter (ADC) having a nominal input voltage range. The method comprises an act of mapping an over-range input voltage that falls outside of the nominal input voltage range to an over-range digital output code. Another embodiment of the invention is directed to an apparatus comprising an ADC having a nominal input voltage range, wherein the ADC is adapted to map an over-range input voltage that falls outside of the nominal input voltage range to an over-range digital output code.

20 Claims, 24 Drawing Sheets

FIG. 5
(PRIOR ART)

| D0 | D1 | D2 | D3 | V0P | V1P | V2P | V3P | V0N | V1N | V2N | V3N |
|----|----|----|----|------|------|------|------|------|------|------|------|
| 0  | 0  | 0  | 0  | REFB | REFB | REFB | REFB | REFT | REFT | REFT | REFT |
| 1  | 0  | 0  | 0  | REFT | REFB | REFB | REFB | REFB | REFT | REFT | REFT |
| 1  | 1  | 0  | 0  | REFT | REFT | REFB | REFB | REFB | REFB | REFT | REFT |
| 1  | 1  | 1  | 0  | REFT | REFT | REFT | REFB | REFB | REFB | REFB | REFT |
| 1  | 1  | 1  | 1  | REFT | REFT | REFT | REFT | REFB | REFB | REFB | REFB |

FIG. 6
(PRIOR ART)

| D0 | D1 | D2 | D3 | B1 | B0 |
|----|----|----|----|----|----|
| 0  | 0  | 0  | 0  | 0  | 0  |
| 1  | 0  | 0  | 0  | 0  | 1  |
| 1  | 1  | 0  | 0  | 1  | 0  |
| 1  | 1  | 1  | 0  | 1  | 1  |
| 1  | 1  | 1  | 1  | 0  | 0  |

FIG. 15

| D0 | D1 | D2 | D3 | B2 | B1 | B0 |
|----|----|----|----|----|----|----|
| 0  | 0  | 0  | 0  | 0  | 0  | 0  |
| 1  | 0  | 0  | 0  | 0  | 0  | 1  |
| 1  | 1  | 0  | 0  | 0  | 1  | 0  |
| 1  | 1  | 1  | 0  | 0  | 1  | 1  |
| 1  | 1  | 1  | 1  | 1  | 0  | 0  |

FIG. 21

| D0 | D1 | D2 | D3 | D4 | D5 | V0P | V1P | V2P | V3P | V4P | V0N | V1N | V2N | V3N | V4N |
|----|----|----|----|----|----|-----|-----|-----|-----|-----|-----|-----|-----|-----|-----|
| 0 | 0 | 0 | 0 | 0 | 0 | REFB | REFB | REFB | REFB | REFB | REFT | REFT | REFT | REFT | REFT |
| 1 | 0 | 0 | 0 | 0 | 0 | CML | REFB | REFB | REFB | REFB | CML | REFT | REFT | REFT | REFT |
| 1 | 1 | 0 | 0 | 0 | 0 | CML | REFT | REFB | REFB | REFB | CML | REFB | REFT | REFT | REFT |
| 1 | 1 | 1 | 0 | 0 | 0 | CML | REFT | REFT | REFB | REFB | CML | REFB | REFB | REFT | REFT |
| 1 | 1 | 1 | 1 | 0 | 0 | CML | REFT | REFT | REFT | REFB | CML | REFB | REFB | REFB | REFT |
| 1 | 1 | 1 | 1 | 1 | 0 | CML | REFT | REFT | REFT | REFT | CML | REFB | REFB | REFB | REFB |
| 1 | 1 | 1 | 1 | 1 | 1 | REFT | REFT | REFT | REFT | REFT | REFB | REFB | REFB | REFB | REFB |

FIG. 22

| D0 | D1 | D2 | D3 | D4 | D5 | B2 | B1 | B0 |
|----|----|----|----|----|----|----|----|----|
| 0 | 0 | 0 | 0 | 0 | 0 | 1 | 1 | 1 |
| 1 | 0 | 0 | 0 | 0 | 0 | 0 | 0 | 0 |
| 1 | 1 | 0 | 0 | 0 | 0 | 0 | 0 | 1 |
| 1 | 1 | 1 | 0 | 0 | 0 | 0 | 1 | 0 |
| 1 | 1 | 1 | 1 | 0 | 0 | 0 | 1 | 1 |
| 1 | 1 | 1 | 1 | 1 | 0 | 1 | 0 | 0 |
| 1 | 1 | 1 | 1 | 1 | 1 | 1 | 0 | 1 |

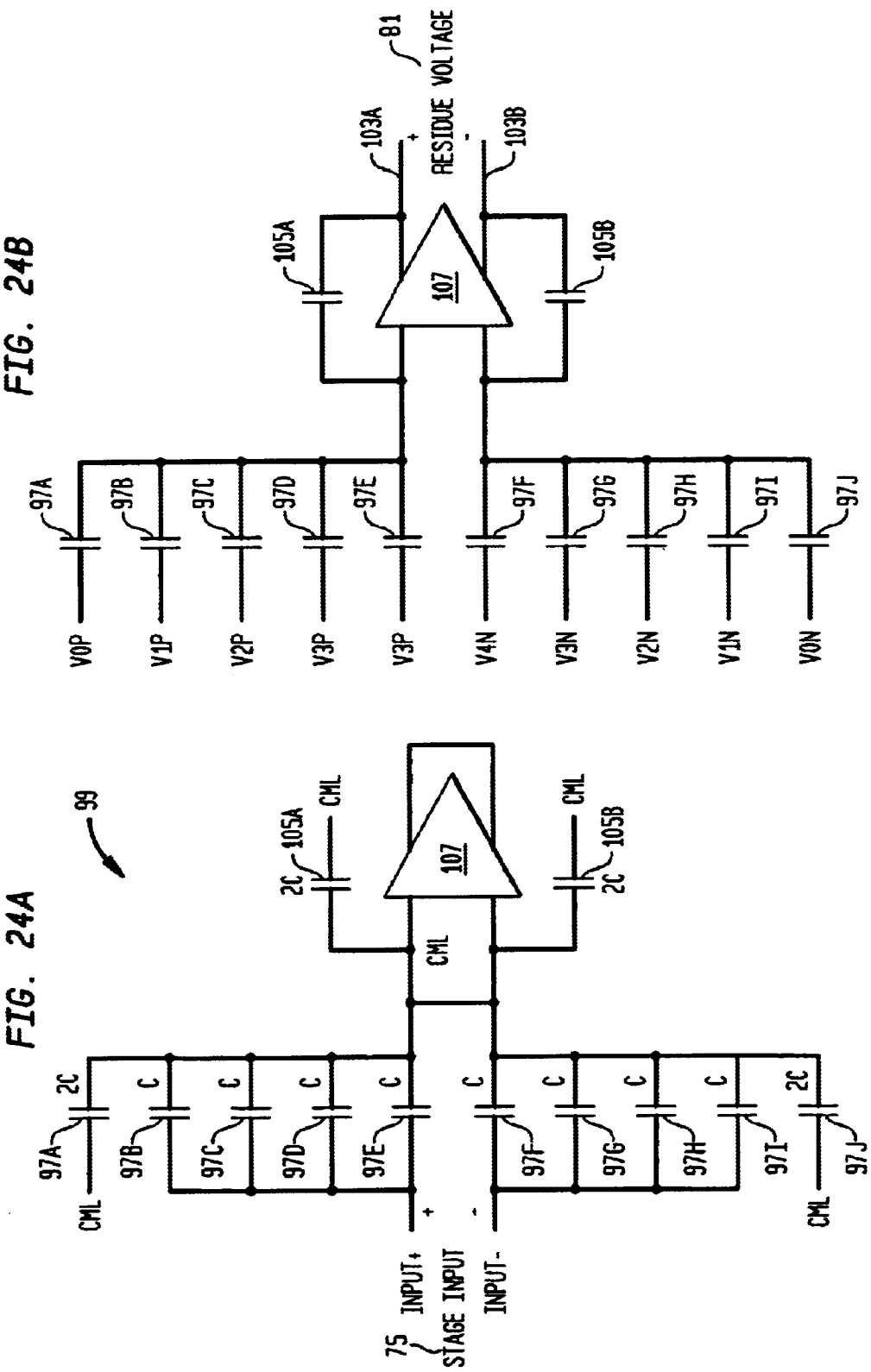

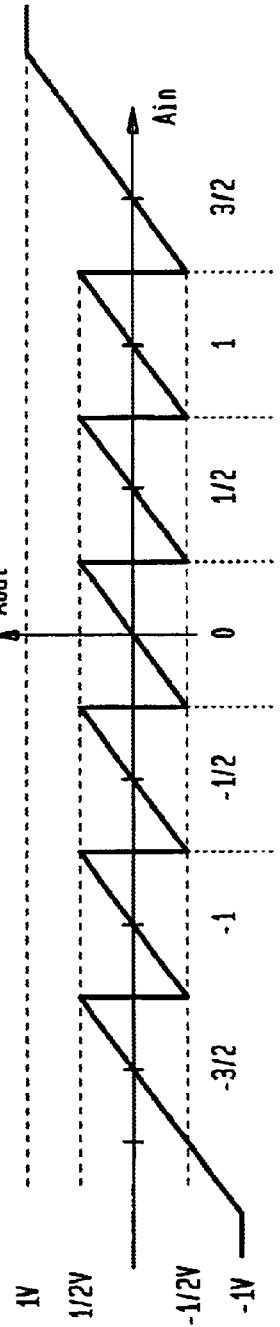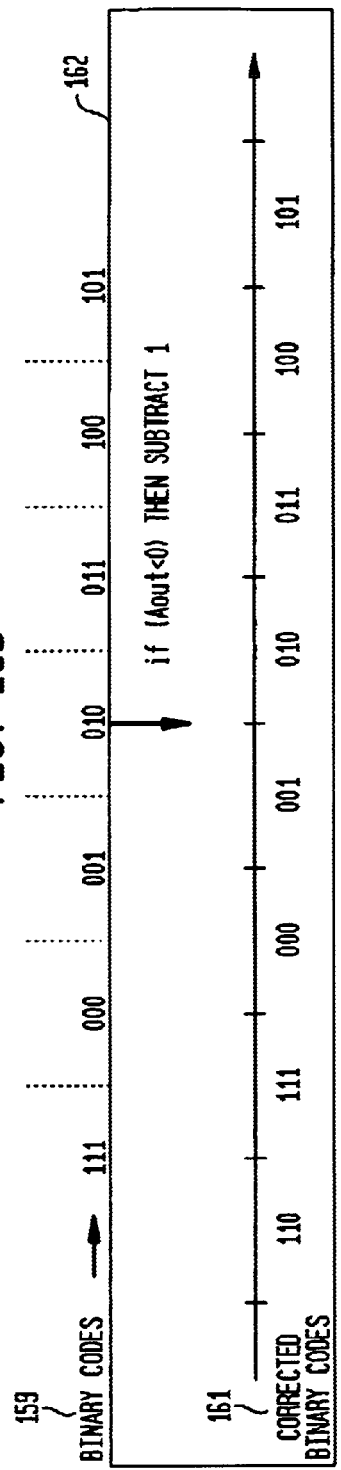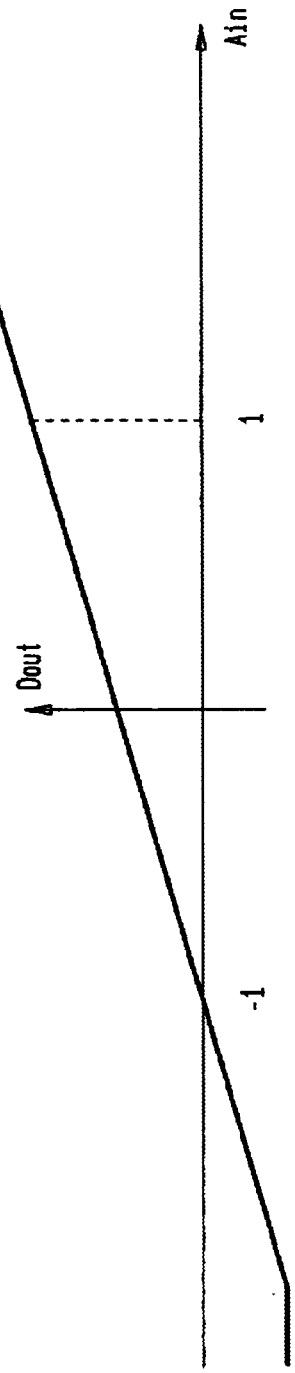

US 6,864,820 B2

ANALOG-TO-DIGITAL CONVERSION USING AN INCREASED INPUT RANGE

CROSS-REFERENCE TO RELATED APPLICATIONS

This application claims the benefit, under 35 U.S.C. §119(e), of the filing date of U.S. provisional application Ser. No. 60/360,499 entitled "Methods for Extending Offset Correction Range in Pipelined ADC System," filed Feb. 28, 2002 and incorporated herein by reference.

FIELD OF THE INVENTION

The present invention is directed generally to the field of analog-to-digital converters. In particular, the invention relates to methods and apparatuses for analog-to-digital converters having an increased input range.

DESCRIPTION OF THE RELATED ART

FIG. 1A illustrates a typical signal processing system 1. Signal processing system 1 includes an analog signal processor (ASP) 3, an analog-to-digital converter (ADC) 5, and a digital signal processor (DSP) 7. ASP 3 processes signals of an analog format, and ADC 5 converts the analog signals into a digital format. DSP 7 processes the signals of a digital format.

Offsets often exist in signal processing system 1, which may result in a difference between a desired output code of ADC 5 and the actual output code for a given reference input. These offsets may be generated in ASP 3, ADC 5, and/or may exist at the input of ASP 3. The offset that may exist at the input of ASP 3 is represented in FIG. 1A as $V_{OS,\ INPUT}$, the offset that may be generated in ASP 3 is represented in FIG. 1A as $V_{OS,\ ASP}$, and the offset that may be generated in ADC 5 is represented in FIG. 1A as $V_{OS,\ ADC}$. Offsets $V_{OS,\ INPUT}$, $V_{OS,\ ASP}$, and $V_{OS,\ ADC}$, are collectively represented in equivalent form at the input of ADC 5 as equivalent voltage offset $V_{OS,\ EQ}$ in FIG. 2.

It is often desirable to cancel this offset to simplify the interface between ADC 5 and DSP 7, and to maintain the dynamic range and DC accuracy of the processed signal. FIGS. 2A and 2B illustrate two conventional methods for correction of offset $V_{OS,\ EQ}$ shown in FIG. 2. FIG. 2A illustrates analog offset correction, wherein a voltage representing the offset voltage at the output of DSP 7 is subtracted from the signal at the input of ADC 5 via offset calibration logic 9. FIG. 2B illustrates digital offset correction, wherein a voltage representing the offset voltage at the output of DSP 7 is subtracted from the signal at the input of DSP 7 via offset calibration logic 8.

Digital offset correction provides certain advantages over analog offset correction. In particular, digital offset correction provides good accuracy, no additional noise, and a flexible response to residual offset error. However, digital offset correction does not eliminate the presence of $V_{OS,\ EQ}$ at the input of ADC 5. The presence of equivalent offset voltage $V_{OS,\ EQ}$ at the input of ADC 5 reduces the dynamic range of ADC 5. Further, if equivalent offset voltage $V_{OS,\ EQ}$ causes saturation of ADC 5 input, digital offset correction cannot be used to correct the offset.

In view of the foregoing, an object of the present invention to provide methods and apparatuses for increasing the input range of an ADC.

SUMMARY OF THE INVENTION

One embodiment of the invention is directed to a method of extending the input range of an analog-to-digital converter (ADC) having a nominal input voltage range. The method comprises an act of mapping an over-range input voltage that falls outside of the nominal input voltage range to an over-range digital output code.

Another embodiment of the invention is directed to an apparatus comprising an ADC having a nominal input voltage range, wherein the ADC is adapted to map an over-range input voltage that falls outside of the nominal input voltage range to an over-range digital output code.

BRIEF DESCRIPTION OF THE DRAWINGS

FIG. 5 shows digital output codes that may be output from the sub-ADC of FIGS. 3–4 and corresponding input voltages for the sub-DAC of FIG. 3;

FIG. 6 shows the correspondence between the thermometer-coded and binary-coded outputs of the sub-ADC of FIG. 4;

FIG. 15 shows the correspondence between the thermometer-coded and binary-coded outputs of the sub-ADC of FIG. 14;

FIG. 21 shows digital output codes that may be output from the sub-ADC of FIG. 20 and corresponding input voltages for the sub-DAC of FIG. 23A;

FIG. 22 shows the correspondence between the thermometer-coded and binary-coded outputs of the sub-ADC of FIG. 20;

FIG. 24A is a schematic representation of the sub-DAC of FIG. 23A activated in a sample phase;

FIG. 24B is a schematic representation of the sub-DAC of FIG. 23A activated in a hold phase; and FIGS. 25A–C show an example of mapping that may occur in the error correction logic of FIG. 19.

DETAILED DESCRIPTION OF THE INVENTION

One aspect of the invention is directed to increasing the input range of an analog-to-digital converter (ADC). According to one embodiment of the invention, input range is increased by mapping one or more digital output codes to one or more portions of the analog input range that are beyond the nominal input voltage range of the ADC. The digital output codes may be unique, and therefore not assigned to voltages in the nominal input voltage range.

Increasing the input range of an ADC has many potential benefits. These benefits may have particular significance when an offset voltage is present at the input of the analog-to-digital converter. An offset voltage at the input of an ADC reduces the dynamic range of the converter. If the input range of an ADC having an input offset voltage is increased, the dynamic range of the ADC may be restored by increasing the input range by an amount greater than or equal to the input offset voltage. Further, if the ADC having the input offset voltage is saturated by an input signal, digital offset correction, which was discussed in connection with FIG. 3B, will not be effective to correct the offset voltage. If the input range of the ADC is increased by an amount greater than or equal to the voltage exceeding the nominal input voltage range of the ADC, saturation may be avoided and digital offset correction may be performed. Although enabling digital offset correction is one benefit of increasing the input range of an ADC, it should be appreciated that many other benefits exist, and that the invention is not limited in this respect. The operation and construction of a conventional ADC will now be described.

Figure 1A:
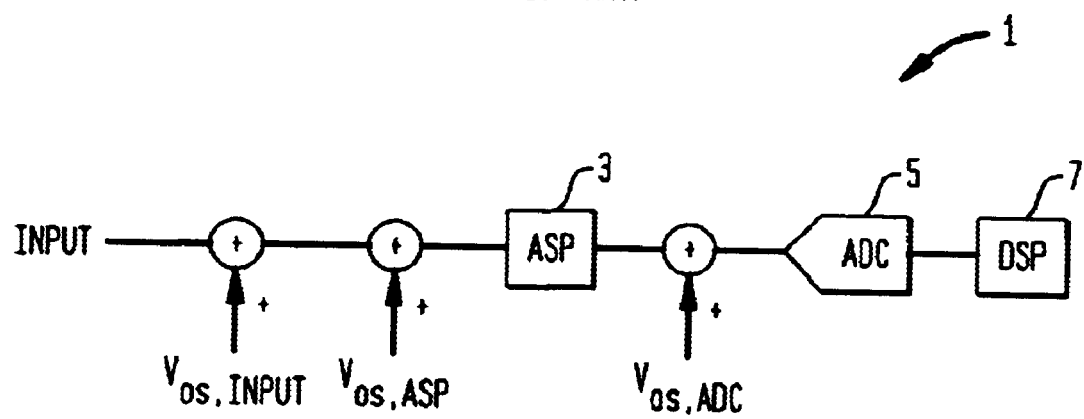
FIG. 1A is a block diagram of a conventional signal processing system with an input offset, analog signal processor offset, and analog-to-digital converter (ADC) offset.
Figure 1B:
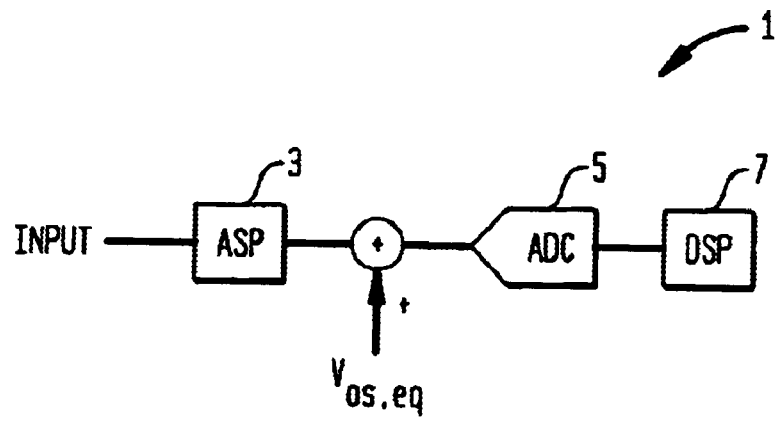
FIG. 1B is a block diagram of the signal processing system of FIG. 1A with an equivalent offset.
Figure 2A:
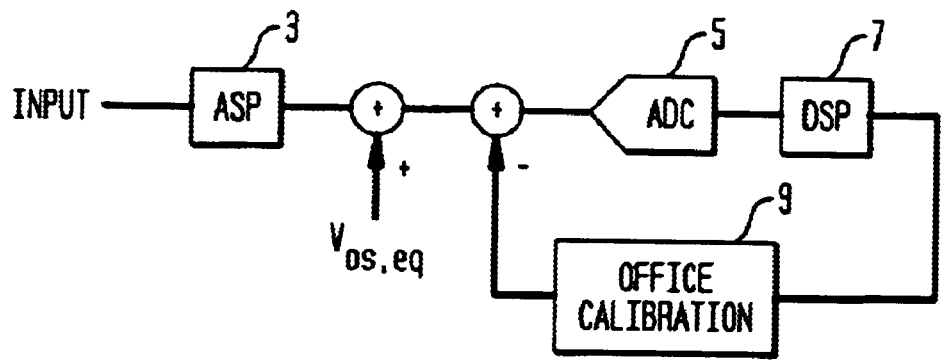
FIG. 2A is a block diagram of the signal processing system of FIG. 1A with analog offset correction.
Figure 2B:
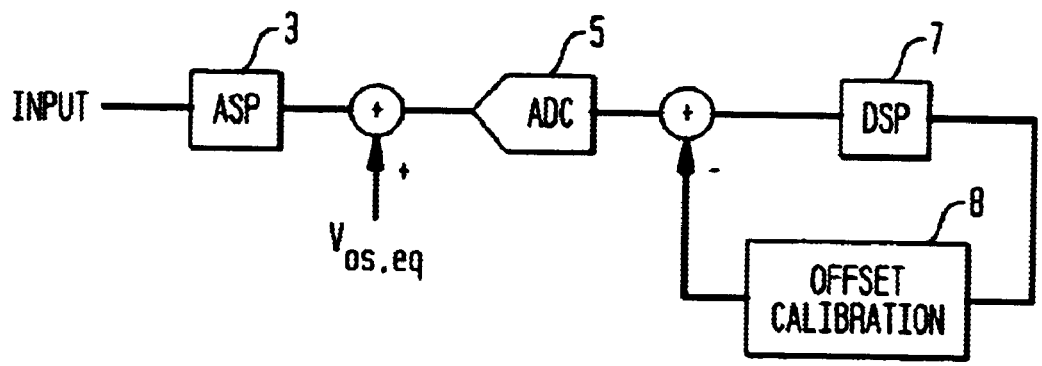
FIG. 2B is a block diagram of the signal processing system of FIG. 1A with digital offset correction.
Figure 3:
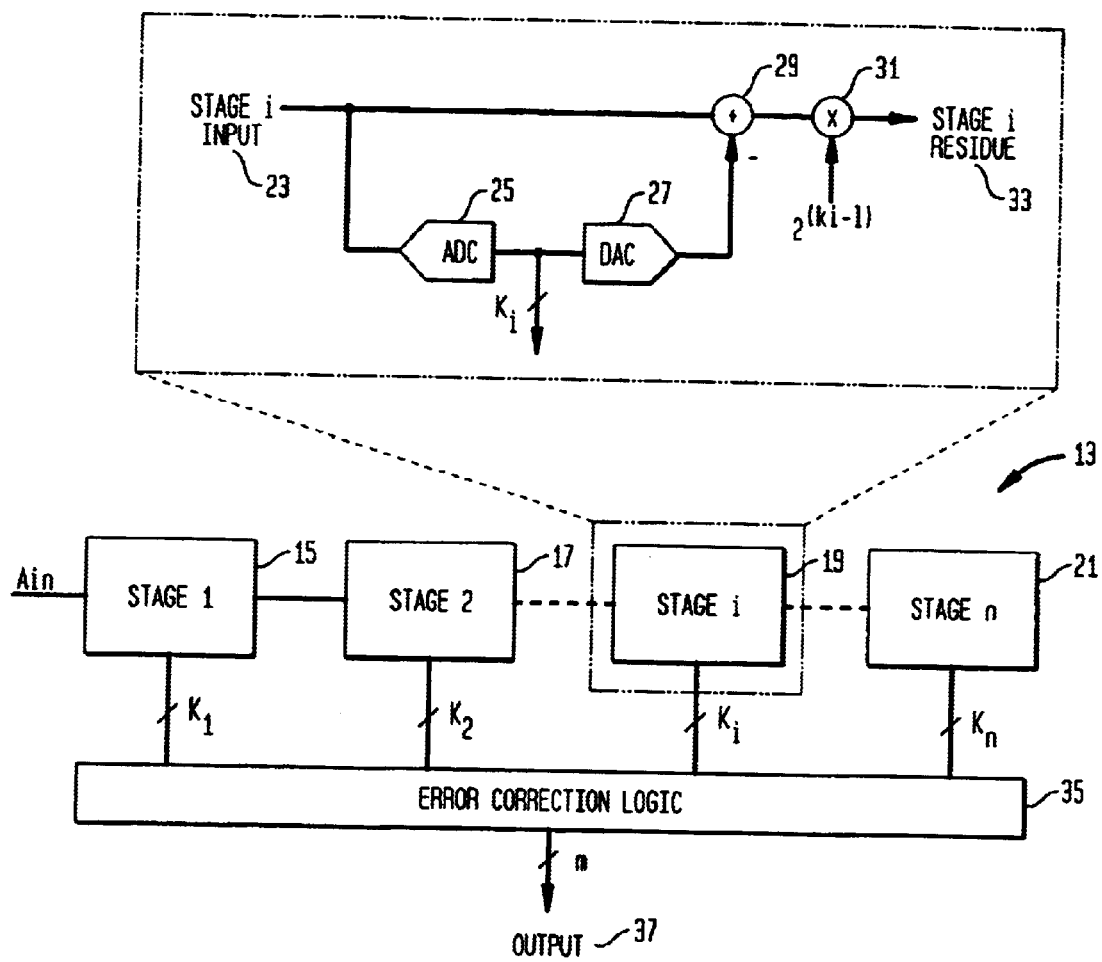
FIG. 3 is a block diagram of a pipelined ADC.

FIG. 3 illustrates one implementation of a conventional ADC, such as ADC 5 of FIGS. 1–3. Many types of ADCs exist, such as flash ADCs, algorithmic ADCs, and pipelined ADCs. FIG. 3 illustrates a block diagram of one exemplary ADC, which is a pipelined ADC 13 that generates m output bits and comprises n stages. Each stage of pipelined ADC 13 operates successively to resolve k bits of the m-bit output. Pipelined ADC 13 of FIG. 3 comprises a first stage 15, a second stage 17, a final nth stage 21, and one or more intermediate stages, such as ith stage 19. First stage 15 accepts a sample of analog signal Ain as stage input 23. Then, as illustrated for ith stage 19, which generically illustrates the processing that occurs in each of stages 1 through n, stage input 23 is quantized to k bits by a sub-ADC 25. These k bits are transmitted to error correction logic 35, which implements synchronization and correction functions. The bits are also transmitted to a sub-digital-to-analog converter (DAC) 27, which converts the digital voltage into an analog voltage. The analog voltage is subtracted from stage input 23 by an adder 29. The result of this operation is then multiplied by a factor of $2^{(ki-1)}$ by a multiplier 31, where i is the stage number. The output of multiplier 31 represents the residue 33 of the stage, which is passed to the input of the next stage, if present, for further processing. After each stage has transmitted k bits to error correction logic 35, the error correction logic assembles and outputs m bits as digital output 37.

Figure 4:
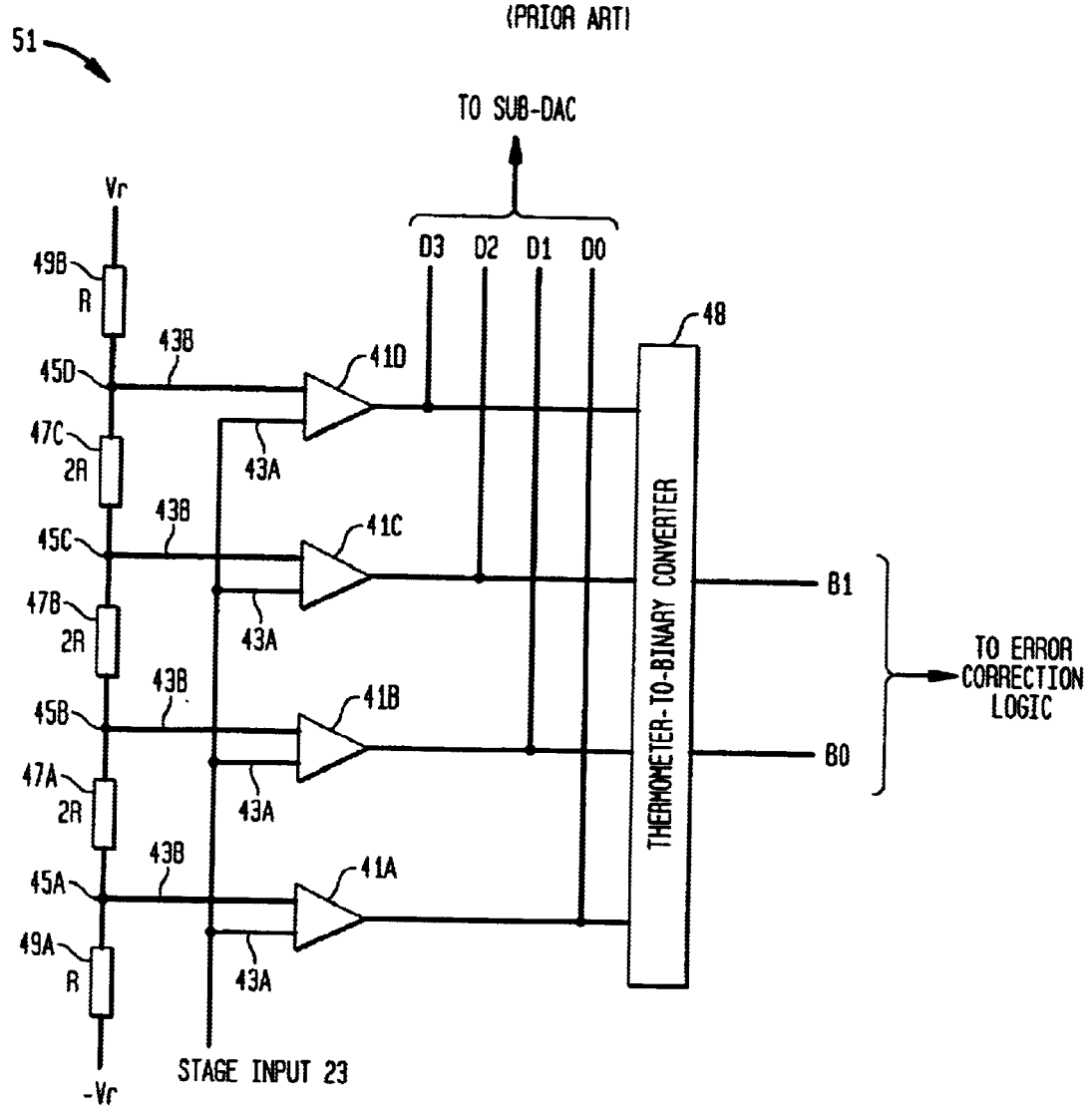
FIG. 4 is a schematic representation of a sub-ADC of the pipelined ADC of FIG. 3.

FIG. 4 illustrates one implementation of sub-ADC 25 of FIG. 3. The sub-ADC 39 of FIG. 4 comprises four comparators 41A–D, each of which outputs one digital bit of a digital output code. Each of comparators 41A–D comprises first and second input terminals 43A–B. The first input terminal 43A of each comparator 41A–D is coupled to stage input 23. The second input terminal 43B of each comparator 41A–D is coupled to a node 45A–D on a string of resistors 51 coupled between two reference voltages −Vr and +Vr, where 2Vr is the nominal input range of sub-DAC 25. As shown, resistors 47A–C have a resistance that is twice that of resistors 49A–B, although other implementations are possible. Because the string of resistors 51 acts as a voltage divider, each node 46A–D on the string is at a different voltage level. Hence, each comparator 41A–D compares stage input 23 with a different voltage level. A logic one is output by any comparator coupled to a node at a lower voltage than stage input 23, and a logic zero is output by comparators coupled to a node at a higher voltage than stage input 23. The voltage level to which stage input 23 is compared is successively higher for comparators 41A, 41B, 41C, and 41D, respectively. Accordingly, comparator 41A outputs the least significant bit of the output code of sub-ADC 39, and comparator 41D outputs the most significant bit.

Comparators 41A–41D may output five different output codes D0–D3, as shown in FIG. 5. Each output code will contain a logic one for each comparator that is connected to a node having a lower voltage than stage input 23. Hence, if none of the comparators is connected to a node on resistor string 51 having a lower voltage than stage input 23, each of comparators 41A–D will output a logic zero, and the output code will be 0000. Conversely, if all of the comparators are connected to a node having a lower voltage than stage input 23, each of comparators 41A–D will output a logic one, and the output code will be 1111.

The output of comparators 41A–41D is transmitted to sub-DAC 27 of FIG. 3 as bits D0–D3. The output is also transmitted to a thermometer-to-binary converter 48, which converts the thermometer code output of comparators 41A–41D to binary code bits B0–B1. The conversion is performed according to the thermometer-binary correspondences set forth in table a FIG. 6. The binary code output of sub-ADC 51 is transmitted to error correction logic 35 (FIG. 3).

Figure 7A:
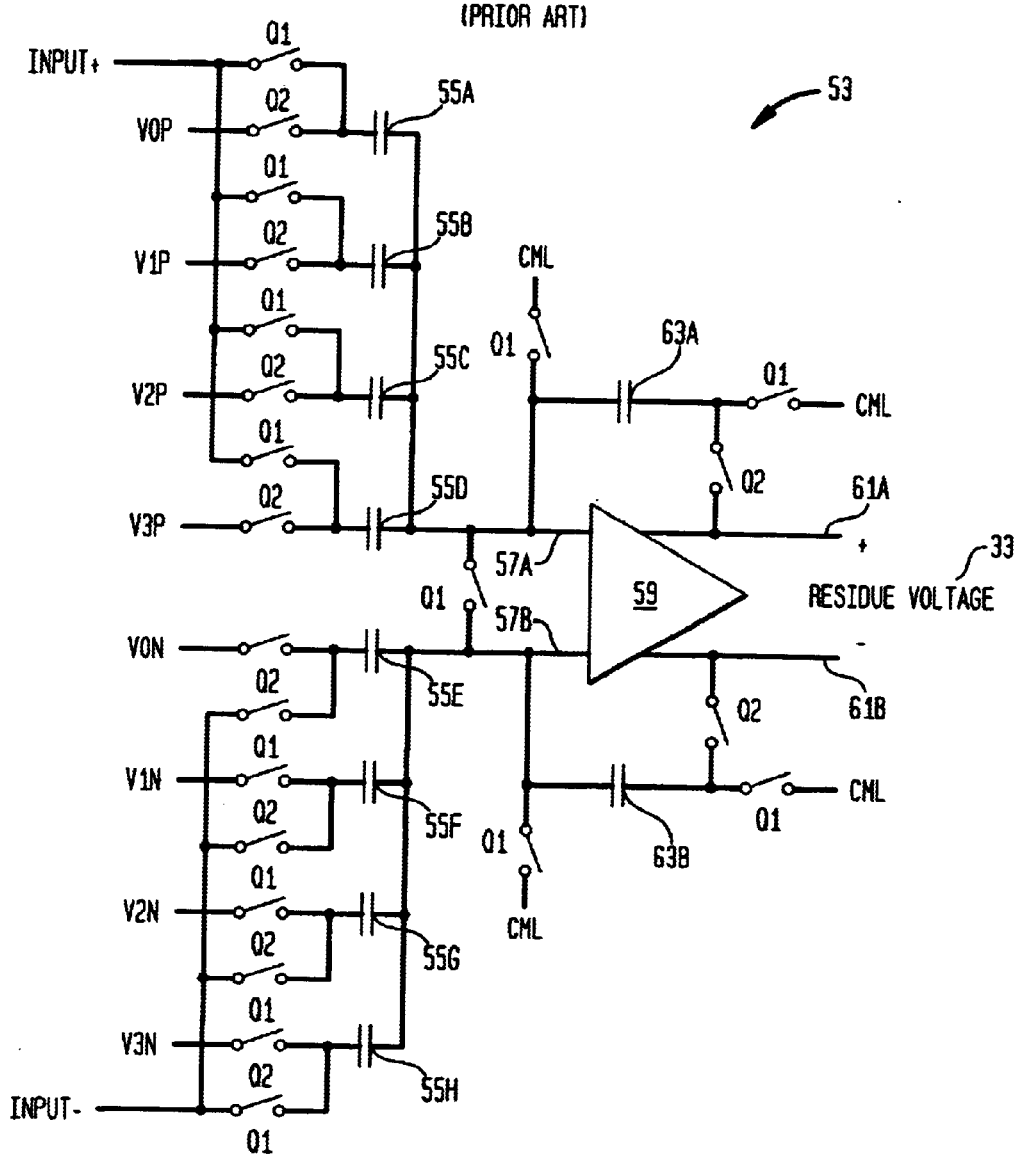
FIG. 7A is a schematic representation of a sub-DAC of the pipelined ADC of FIG. 3.

FIG. 7A, illustrates one implementation of the sub-DAC 27, adder 29, and multiplier 31 of FIG. 3. In particular, FIG. 7A illustrates a block diagram of a conventional 2-bit multiplying digital-to-analog converter (MDAC) 53. MDAC 53 comprises inputs INPUT+ and INPUT− for receiving a stage input. MDAC 53 further comprises four pairs of input capacitors, each input capacitor 55A–H connected via a switch Q1 to one of the inputs INPUT+ or INPUT−. Each of input capacitors 55A–H is also connected to a reference voltage, either top reference voltage REFT or bottom reference voltage REFB, at a node V0P–V3N via a switch Q2. Half of the input capacitors are connected to a first input terminal 57A of an operational amplifier 59, and half of the input capacitors are connected to a second input terminal 57B of operational amplifier 59. The first and second input terminals 57A–B are also connected to common mode level voltage CML, via switches Q1, and to first and second output terminals 61A–B of operational amplifier 59 via switches Q2 and feedback capacitors 63A–B. Feedback capacitors 63A–B may have a capacitance that is twice that of input capacitors 55A–H. The first and second input terminals 57A–B of operational amplifier 59 are linked via a switch Q1.

Figure 7B:
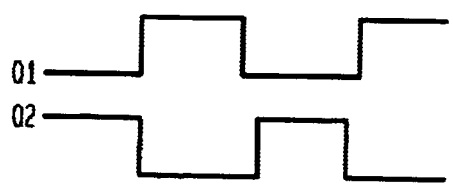
FIG. 7B shows voltage signals used in the activation of switches in the sub-DAC of FIG. 7A.

MDAC 53 is activated in two phases: a sample phase and a hold phase. The activation of the two phases may be controlled by signals that control switches Q1 and Q2. An example of such signals is shown in FIG. 7B. The sample phase, during which switches Q1 are closed, is illustrated in FIG. 7A. When switches Q1 are closed, four input capacitors 55A–D are connected in parallel between INPUT+ and common mode level voltage CML, and the remaining four input capacitors 55E–H are connected in parallel between INPUT– and common mode level voltage CML. Each of input capacitors 55A–H may have an equivalent capacitance. Because stage input 23 is applied between INPUT+ and INPUT–, input capacitors 55A–H are charged according to the magnitude of stage input 23.

Figure 8A:
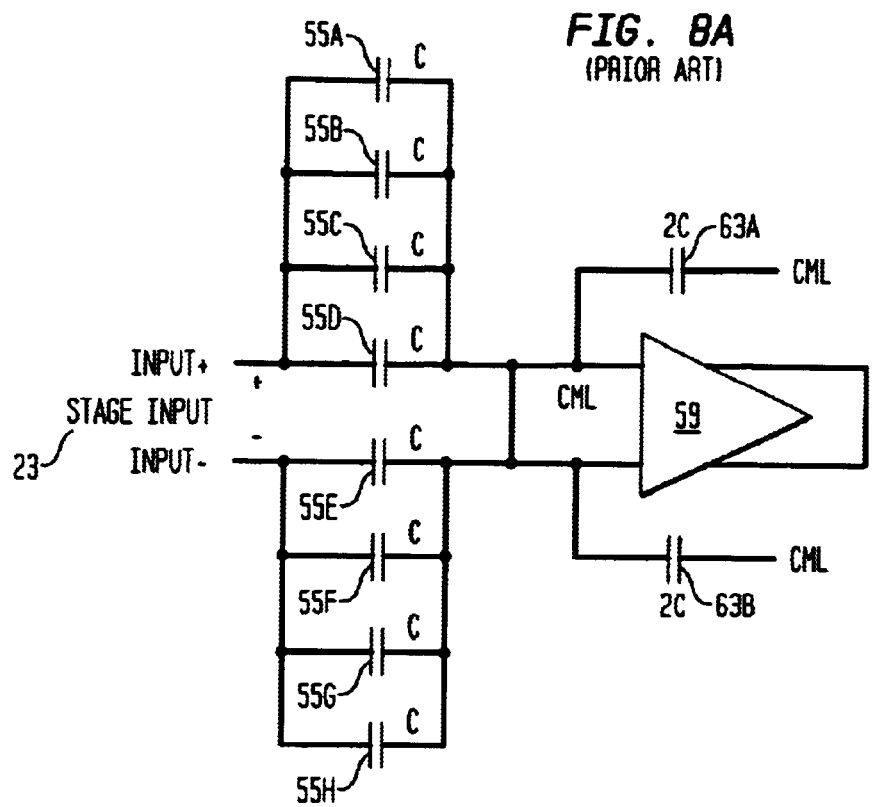
FIG. 8A is a schematic representation of the sub-DAC of FIG. 7A activated in a sample phase.
Figure 8B:
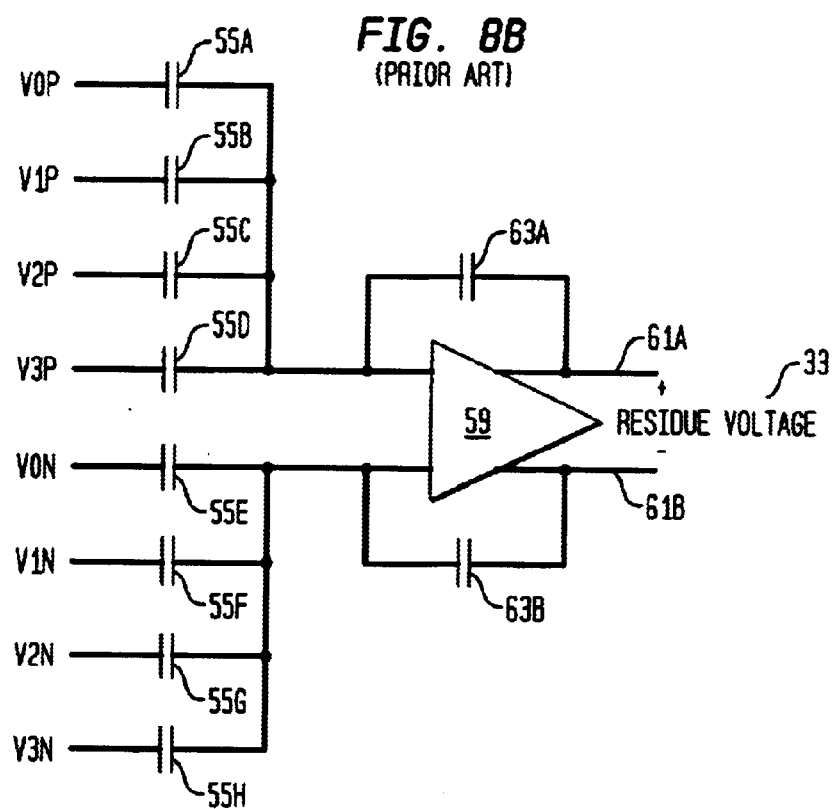
FIG. 8B is a schematic representation of the sub-DAC of FIG. 7A activated in a hold phase.

After a time sufficient for input capacitors 55A–H to charge, switches Q1 are opened and switches Q2 are closed. In one example, switches Q2 may be closed after switches Q1 are opened. The hold phase, during which switches Q2 are closed, is illustrated in FIG. 8B. When switches Q2 are closed, each input capacitor 55A–H is connected to a reference voltage, either top reference voltage REFT or bottom reference voltage REFB, selected according to the digital output of sub-ADC 39. FIG. 5 illustrates the voltage applied to each input capacitor 55A–H in FIG. 7A for each of five possible output codes of sub-ADC 39. As may be appreciated from the table, each pair of input capacitors 55A–H includes one capacitor coupled to top reference voltage REFT and one capacitor coupled to bottom reference voltage REFB. The difference between top reference voltage REFT and bottom reference voltage REFB is Vr. Hence, either +Vr or –Vr is applied to each pair of input capacitors, according to the output code of sub-ADC 39. For example, if the output code of sub-ADC 39 is 0000, –Vr is applied to each pair, and if the output code of sub-ADC 39 is 1111, +Vr is applied to each pair. A charge proportional to the difference between stage input 23 and its quantized approximation is forced onto feedback capacitors 63A–B, which produces residue voltage 33 across outputs 61A–B.

Figure 9A:
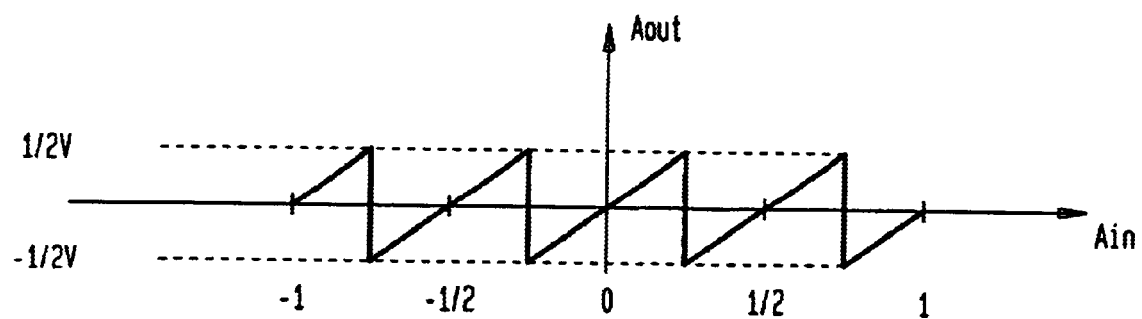
FIG. 9A shows the residue plot output of the sub-DAC of FIG. 7A
Figure 9B:
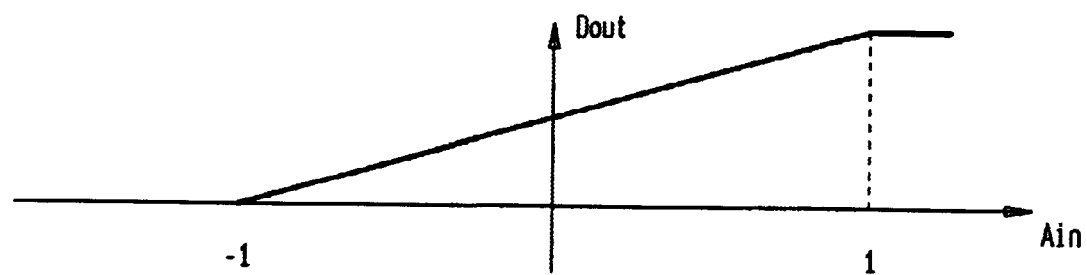
FIG. 9B shows the transfer function of the pipelined ADC of FIG. 3.
Figure 9C:
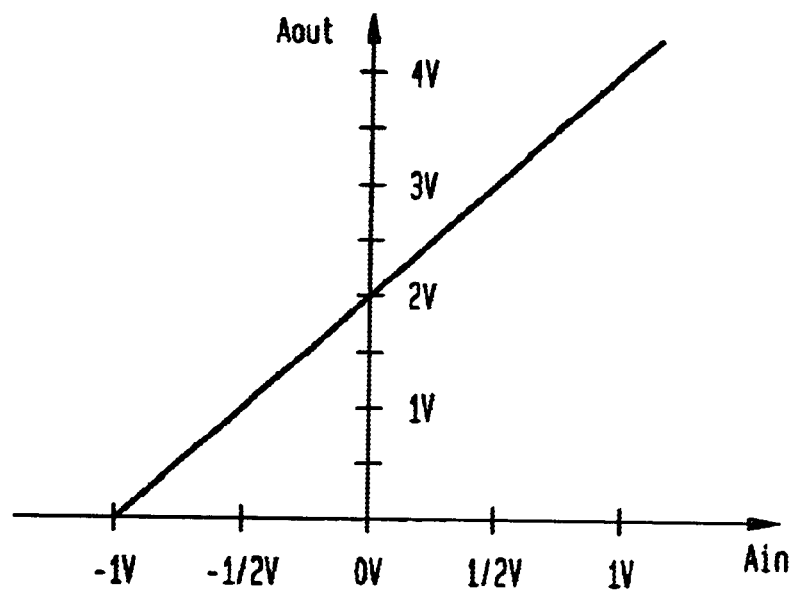
FIG. 9C shows an ideal transfer function for the sub-ADC of FIG. 3.
Figure 9D:
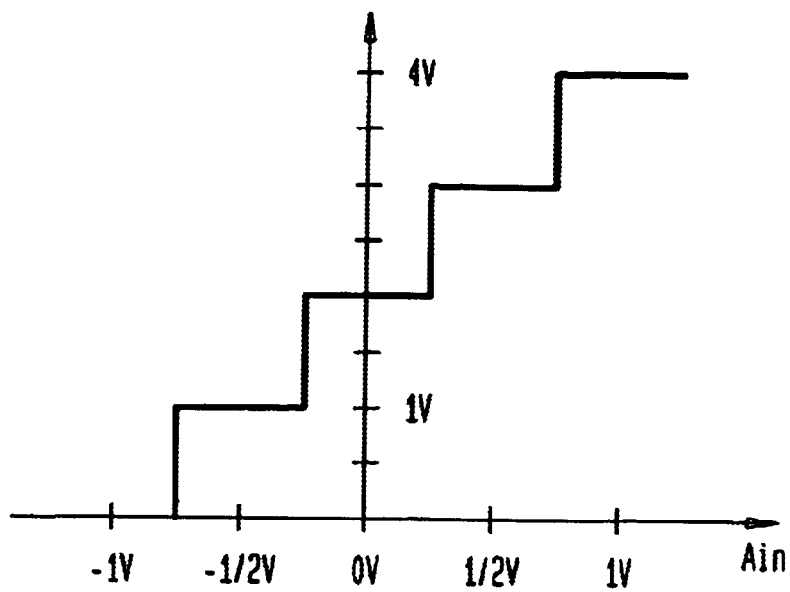
FIG. 9D shows an output of the sub-ADC of FIG. 3.

FIG. 9A illustrates an example of a residue plot for a conventional stage generating 2 bits (i.e., k=2). The residue plot results from the subtraction of Ain, shown in FIG. 9C with relation to the Aout, and Ain quantized to two bits, shown in FIG. 9D. The ideal transfer function of sub-ADC 27 of FIG. 3 is shown as a voltage ramp in FIG. 9C. A 2-bit quantization of the voltage ramp shown in FIG. 9C results in the step function shown in FIG. 9D. As shown in FIG. 9B, the nominal input range of sub-ADC 25 (FIG. 3) spans from –1V to 1V. The nominal input range represents the range of Ain for which unique output codes ordinarily exist in a conventional ADC. Hence, the maximum analog voltage in the nominal input range is assigned to the maximum digital output code generated in a conventional ADC, and the minimum analog voltage in the nominal input range is assigned to the minimum digital output code. Above and below the nominal input range, the output is clipped to avoid duplicate output codes.

Figure 10A:
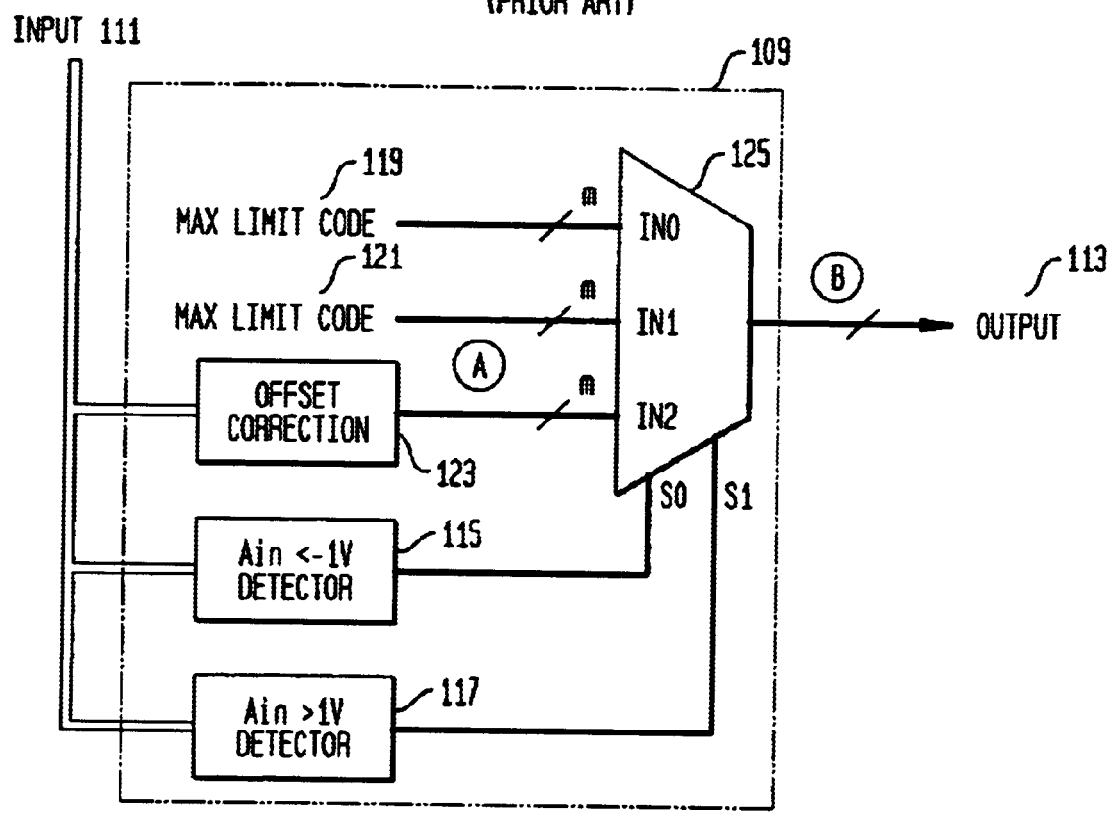
FIGS. 10A–C show one implementation of the error correction logic of FIG. 3.
Figure 10B:
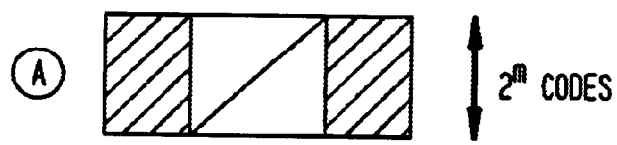
Figure 10C:
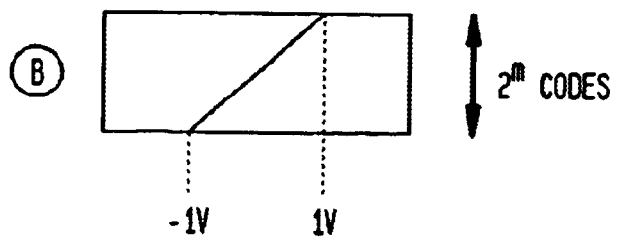

FIGS. 10A–C illustrate one implementation of the error correction logic 35 of FIG. 3. Error correction logic 109 accepts the binary output codes of the sub-ADC 25 of each stage of FIG. 3 as input 111, and generates an m-bit output code as output 113. Offset corrector 123 corrects for quantization errors of the input 111, and maps the received codes to the transfer function shown in FIG. 10B. The transfer function of FIG. 10B maps those codes falling within the nominal input range of the ADC 13, which is between –1V and +1V in the example of FIGS. 10A–C. Error correction logic 109 detects codes representing an analog input voltage outside of the nominal input range. In particular, detector 115 detects "below-range" codes, or those corresponding to an analog input below –1V. Detector 117 detects "above-range" codes, or those corresponding to an analog input above +1V. Error correction logic 109 sets all "below-range" codes to a minimum limit code 121, which may be "00" in one example. Conversely, error correction logic 109 sets all "above-range" codes to a minimum limit code 119, which may be "11" in one example. Logic circuit 125 processes the outputs of detector 115, detector 117, and offset correction 123 and outputs m bits as output 113.

Figure 11A:
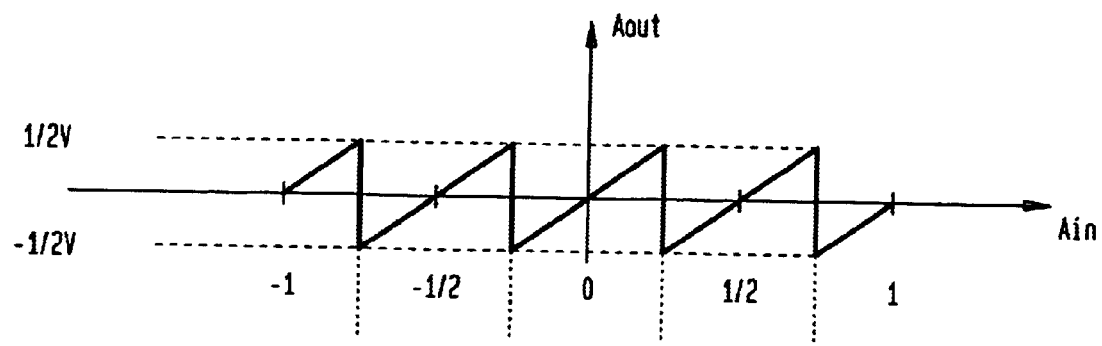
FIGS. 11A–C show one example of mapping that may occur in the error correction logic of FIG. 3.
Figure 11B:
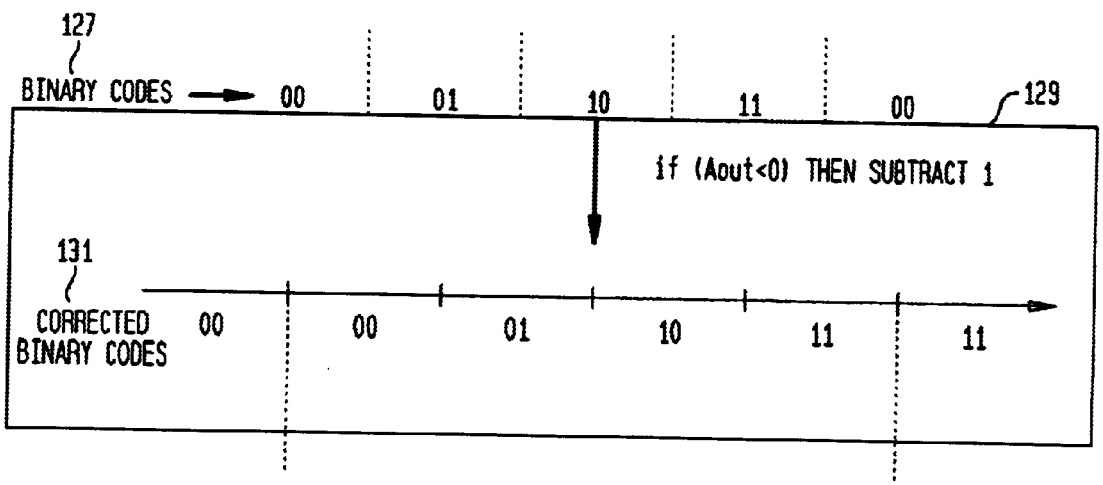
Figure 11C:
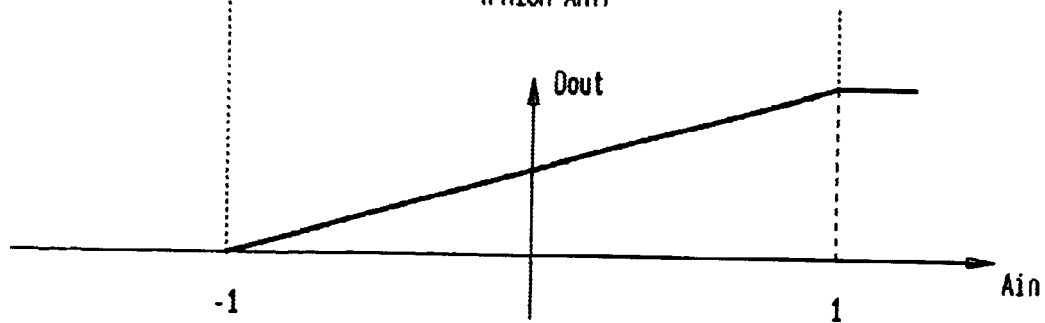

FIGS. 11A–C show one example of mapping that may occur in the error correction logic 109 of FIG. 10A. FIG. 11A illustrates one example of an assignment of binary codes 127, output from sub-ADC 39, to the residue segments of the residue plot of FIG. 9A. Mapping algorithm 129, shown in FIG. 11B, maps binary codes 127 to the transfer function of FIG. 11C. Mapping algorithm 129, which may be implemented as circuitry in the offset corrector 123 of FIG. 10A, reassigns binary codes 127 to corrected binary codes 131. The mapping algorithm computes the reassignment by identifying regions of the residue plot of FIG. 11A where Aout is less than zero, and subtracting one from the corresponding binary code 127 of each identified region. The mapping that occurs via mapping algorithm 129 results in a transfer function for pipelined ADC 13 as shown in FIG. 11C.

In the conventional ADC discussed above in connection with FIGS. 1–11, unique digital output codes are generated for the analog voltages within the nominal input range of the ADC. Hence, the minimum value digital code of 00 was assigned to the minimum analog voltage within the nominal input range (i.e., –1V) and the maximum value digital code of 11 was assigned to the maximum analog voltage within the nominal input range (i.e., +1V). According to this scheme, the ADC output m bits, and hence $2^m$ output codes.

In accordance with one embodiment of the invention, the input range of a conventional ADC is extended to allow over-range input voltages outside of the nominal input range of the ADC. The over-range voltages may be converted to unique digital output codes. Hence, the number of output codes that may be generated by the ADC is increased with respect to a conventional ADC. The dynamic range of the ADC is also increased. A first illustrative embodiment of an ADC having an extended input range will be discussed below in connection with FIGS. 12–17.

Figure 12:
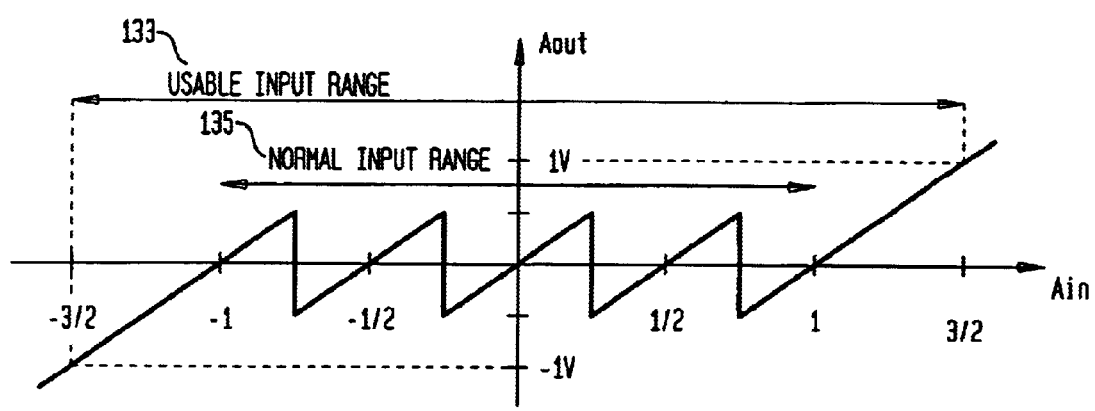
FIG. 12 shows the usable input range of a pipelined ADC constructed in accordance with an embodiment of the invention.

FIG. 12 illustrates the residue plot of FIG. 3 for an extended input range. The nominal input range 135 of the residue plot of FIG. 12 extends from –1V to +1V, as was the case in FIG. 3. However, in FIG. 3, analog output voltages falling outside of the nominal input range were clipped. In a conventional ADC, the voltages above and below the nominal input range are clipped, as these regions produced no unique output codes and are unnecessary for conversion of the analog input. These regions are also unusable for conversion of the analog output as no additional useful information exists in these regions. However, it may be appreciated from FIG. 12 that the analog output Aout of a sub-DAC continues to change beyond the nominal input range in the "above-range" region above 1V and the "below-range" region below –1V.

In accordance with the present embodiment, an ADC may be adapted to convert above-range voltages and/or below-range voltages to unique output codes. One exemplary implementation of such an ADC will now be discussed in connection with pipelined ADC 12 of FIG. 13. However, it should be appreciated that the invention is not limited in this respect, and that other types of ADCs, such as a flash ADC or algorithmic ADC, may be adapted to convert above-range voltages and/or below-range voltages to unique output codes by applying the principles described herein.

Figure 13:
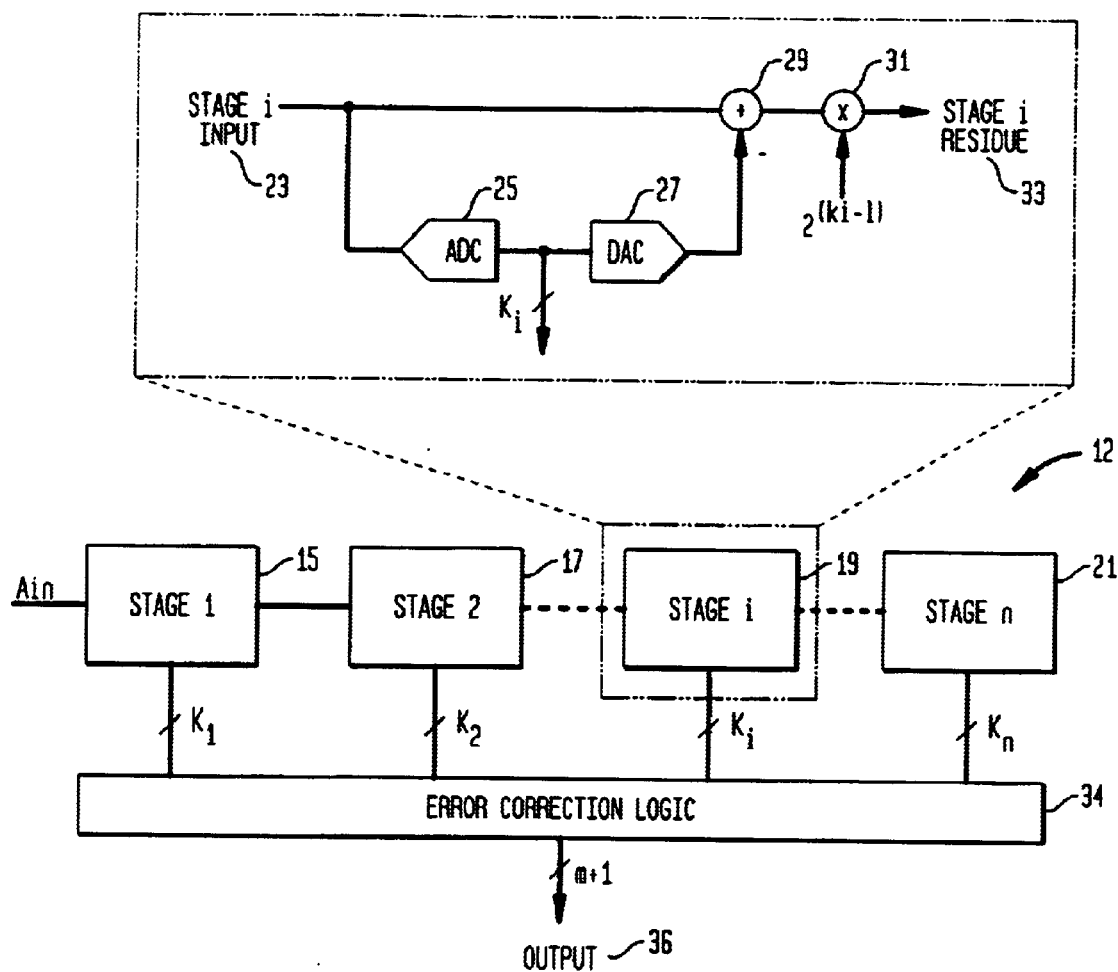
FIG. 13 is a block diagram of a pipelined ADC in accordance with one embodiment of the invention.

FIG. 13 illustrates a pipelined ADC 12 that is similar in many respects to the pipelined ADC 13 of FIG. 3, but has been modified in accordance with one implementation of the presently described embodiment. In particular, sub-ADC 26 has been modified as discussed in connection with FIG. 14, and error correction logic 34 has been modified as discussed in connection with FIGS. 16–17 and generates an m+1 bit output 36. In other respects, pipelined ADC 65 operates according to the same principles as the pipelined ADC 13 described in connection with FIG. 3.

In the residue plot of FIG. 13 nominal input range 135 extends from −Vr to +Vr, where Vr equals 1V. The usable input range 133 extends from −3/2Vr to +3/2Vr. Hence, as may be appreciated from the residue plot of FIG. 12, the usage input range of ADC 13 (FIG. 3) may be increased by $Vr/2^{(k-2)}$, where k is the number of bits resolved in the stage. Hence, the dynamic range of the ADC may be increased by Vr, beyond the nominal input range of 2Vr, when k equals 2.

Figure 14:
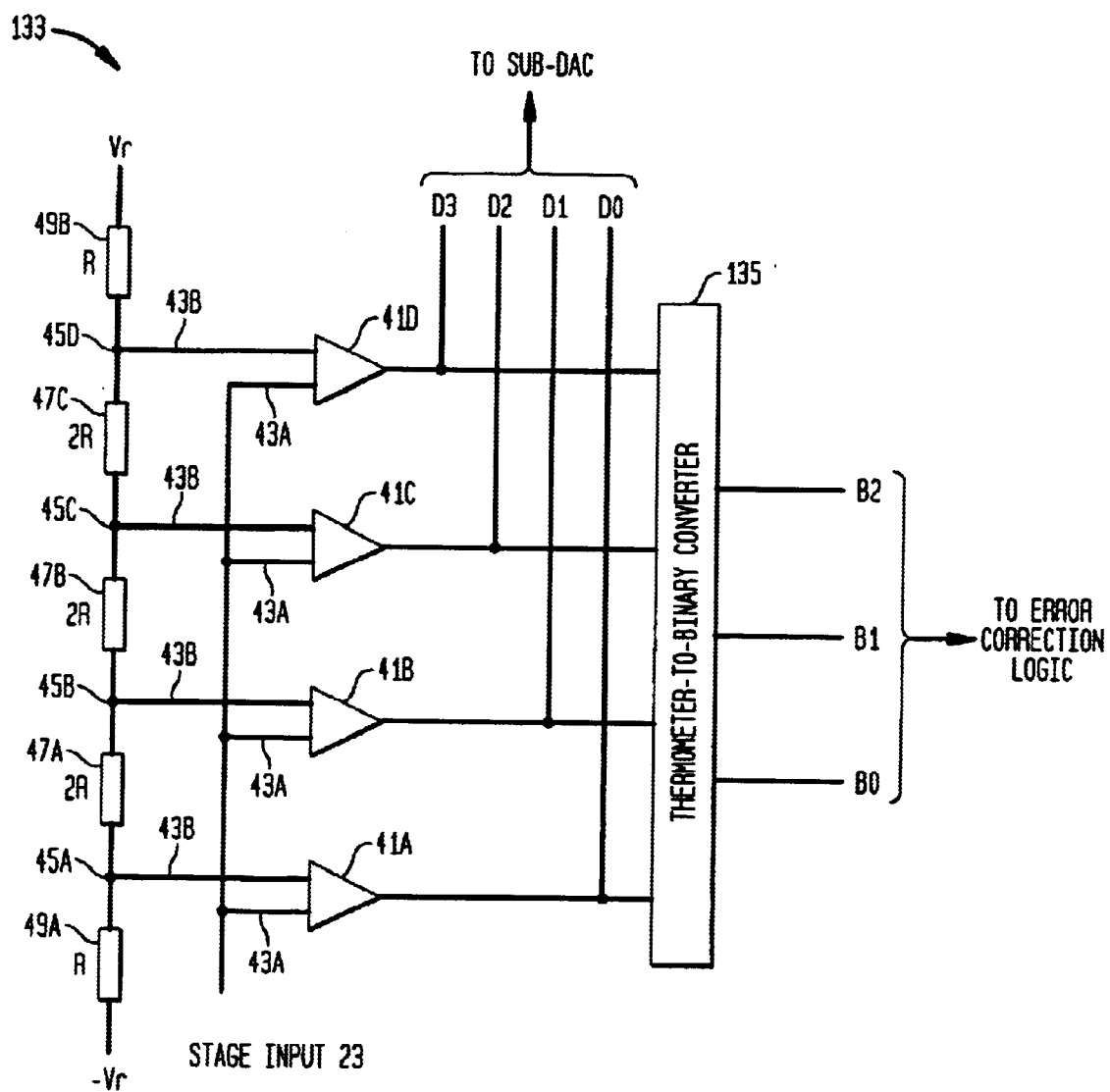
FIG. 14 is a schematic representation of one implementation of the sub-ADC of FIG. 13 in accordance with an embodiment of the invention.

FIG. 14 illustrates an exemplary implementation of the sub-ADC 26 of FIG. 13 in accordance with the presently described embodiment. Sub-ADC 133 of FIG. 14 is implemented as shown and described for the sub-ADC 51 of FIG. 4, with the exception of thermometer-to-binary converter 135. As shown in FIG. 15, thermometer-to-binary converter 135 converts the thermometer code output of comparators 41A–41D to a three-bit binary code as bits B0–B2. The conversion is performed according to the thermometer-binary correspondences set forth in FIG. 15. Since the output of comparators 41A–41D is converted to a three-bit binary code, rather than a two-bit binary code as in the sub-ADC 51 of FIG. 4, a unique code may be assigned for each of the five possible thermometer output codes of comparators 41A–41D. The three-bit binary code output of sub-ADC 133 is transmitted to error correction logic 35 (FIG. 3).

FIGS. 16A–E illustrate an exemplary implementation of the error correction logic 34 of FIG. 13 in accordance with the presently described embodiment. Error correction logic 139 accepts the binary output codes of the sub-ADC 26 of each stage of FIG. 13, which may be implemented as shown for sub-ADC 133 of FIG. 14, as input 137. Error correction logic 139 generates an m+1 bit output code as output 141. Error correction logic 139 detects codes representing an analog input voltage outside of nominal input range 135 (FIG. 12). In particular, detector 143 detects "below-range" codes, or those corresponding to an analog input below −1V. Detector 145 detects "above-range" codes, or those corresponding to an analog input above +1V.

Code mapper 147 processes the below-range codes by mapping the codes to the partial transfer function of FIG. 16B. The transfer function of FIG. 16B maps those codes falling below the nominal input range of ADC 133, which is below −1V in the present example. Similarly, code mapper 149 processes the above-range codes by mapping the codes to the partial transfer function of FIG. 16C. The transfer function of FIG. 16C maps those codes falling above the nominal input range of ADC 133, which is above +1V in the present example. Offset corrector 151 corrects for quantization errors of the input 137, and processed the codes within the nominal input range by mapping the codes to the transfer function of FIG. 16D. The transfer function of FIG. 16D maps those codes falling within the nominal input range of the ADC 133, which is between −1V and +1V in the present example.

Logic circuit 153 processes the outputs of detectors 143, 145, code mapper 147, code mapper 149, and offset corrector 151, and outputs m+1 bits as output 141. Thus, it should be appreciated that for an m–bit ADC, the techniques described in connection with FIGS. 12–16 provide an additional output bit relative to the conventional ADC described previously.

Figure 16A:
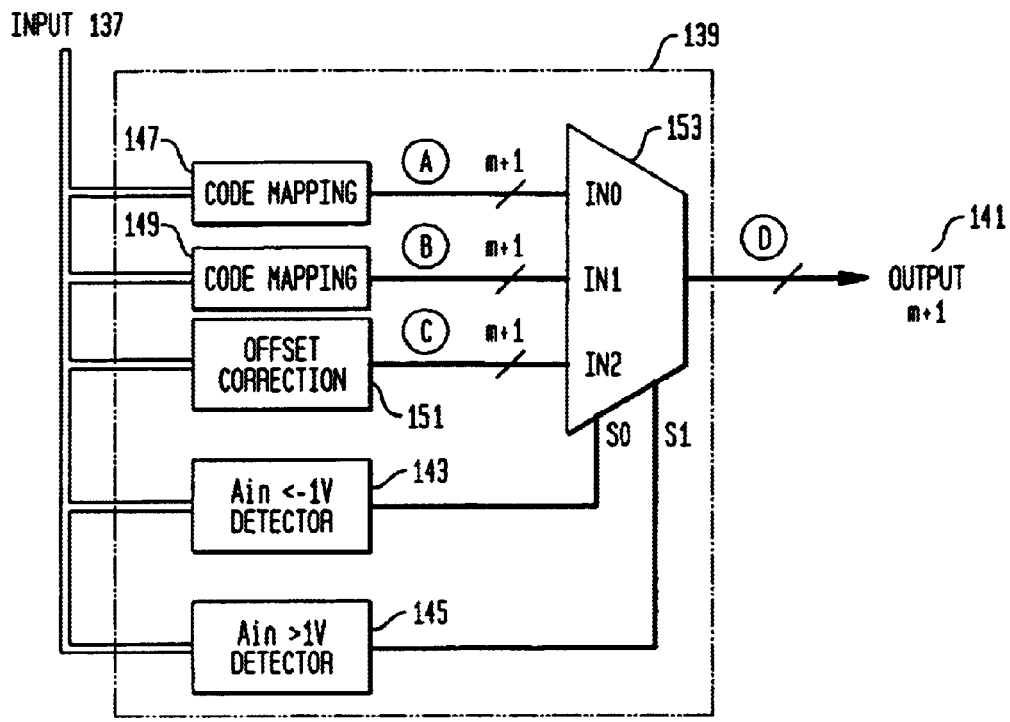
FIGS. 16A–E show an implementation of the error correction logic of FIG. 3 in accordance with an embodiment of the invention.
Figure 16B:
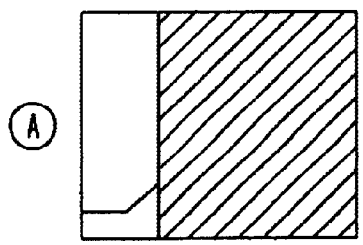
Figure 16C:
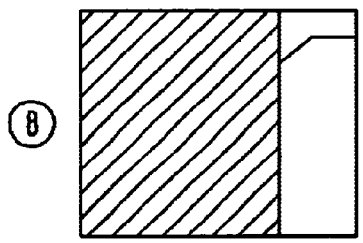
Figure 16D:
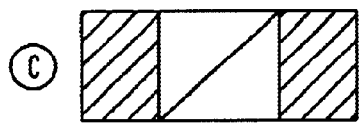
Figure 16E:
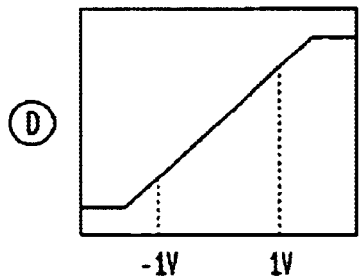
Figure 17A:
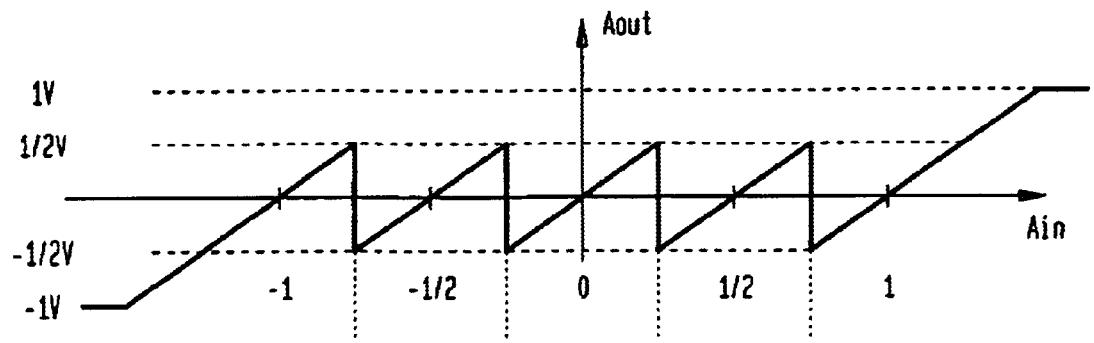
FIGS. 17A–C show an example of mapping that may occur in the error correction logic of FIG. 3 in accordance with an embodiment of the invention.
Figure 17B:
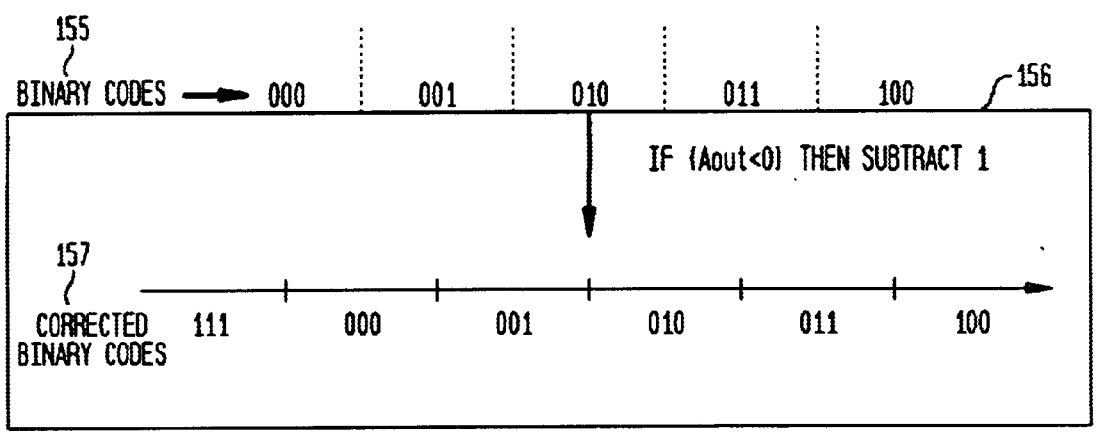
Figure 17C:
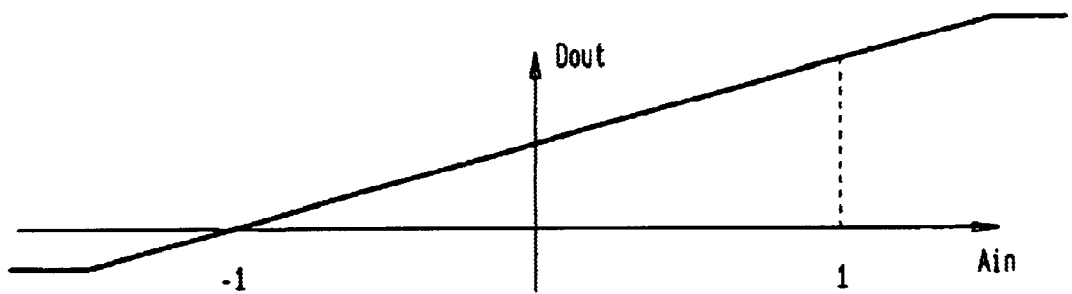

FIGS. 17A–C show one example of mapping that may occur in the error correction logic 139 of FIG. 16A. FIG. 17A, illustrates one example of an assignment of binary codes 155, output from sub-ADC 133, to the residue segments of the residue plot of FIG. 12. Mapping algorithm 156, shown in FIG. 17B, maps binary codes 155 to the transfer function of FIG. 17C. Mapping algorithm 156, which may be implemented as circuitry in the code mappers 147, 149 and offset corrector 151 of FIG. 16A, reassigns binary codes 155 to corrected binary codes 157. The mapping algorithm computes the reassignment by identifying regions of the residue plot of FIG. 17A where Aout is less than zero, and subtracting one from the corresponding binary code 155 of each identified region. The mapping that occurs via mapping algorithm 156 results in a transfer function for pipelined ADC 13 as shown in FIG. 17C. It should be appreciated that the mappings described above are given by way of example only, and that numerous alternative mappings are possible, and may be used in accordance with the invention.

According to another embodiment of the invention, an ADC may be modified to further increase the input range of the ADC by assigning one or more additional unique codes in the over-range regions. In one illustrative implementation, which will be described in connection with FIGS. 18–25, a pipelined ADC is modified so that, in one or more stages, a sub-ADC thereof generates one or more residue segments outside of the nominal input voltage range. Each additional residue segment may produce an additional stage output code. The stage output codes may be processed in error correction logic of the ADC to generate additional ADC output codes outside of the nominal input voltage range.

Figure 18A:
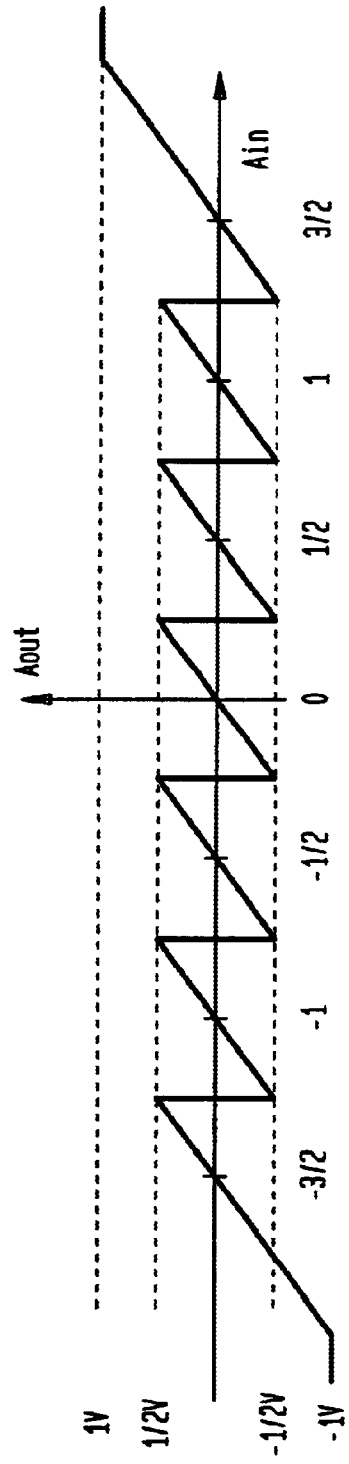
FIG. 18A shows a residue plot of a pipelined ADC constructed in accordance with another embodiment of the invention.
Figure 18B:
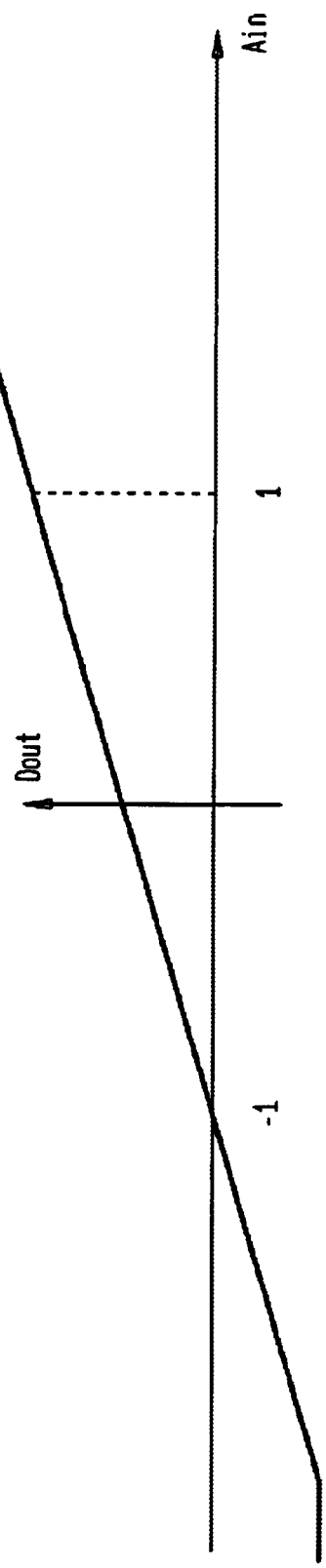
FIG. 18B shows the transfer function of a pipelined ADC having the residue plot of FIG. 18A.

FIG. 18A illustrates an example of a residue plot for a stage of an ADC having residue segments outside of the nominal input voltage range. The residue plot of FIG. 18A corresponds to an ADC having a nominal input voltage range of −1V to +1V. In FIG. 18A, complete residue segments exist between each of −2V and −5/4V and +5/4V and +2V, beyond the nominal input voltage range of the ADC. A unique output code may be assigned to each segment, extending the usable input range of the ADC to between −2V and +2V. As shown in FIG. 18B, the usable input range of the modified ADC is double that of the nominal input range.

As may be appreciated from the reside plot of FIG. 18A, input range may be increased by $Vr/2^{(k-1)}$ for each residue segment added, where k is the number of bits resolved in the stage, and Vr is one half of the nominal input range. Hence, the dynamic range of the ADC may be increased by 2Vr beyond the nominal input range of 2Vr. As shown in FIG. 18A, the usable input range extends between 2Vr and −2Vr, or 2V and −2V where Vr=1V.

Figure 19:
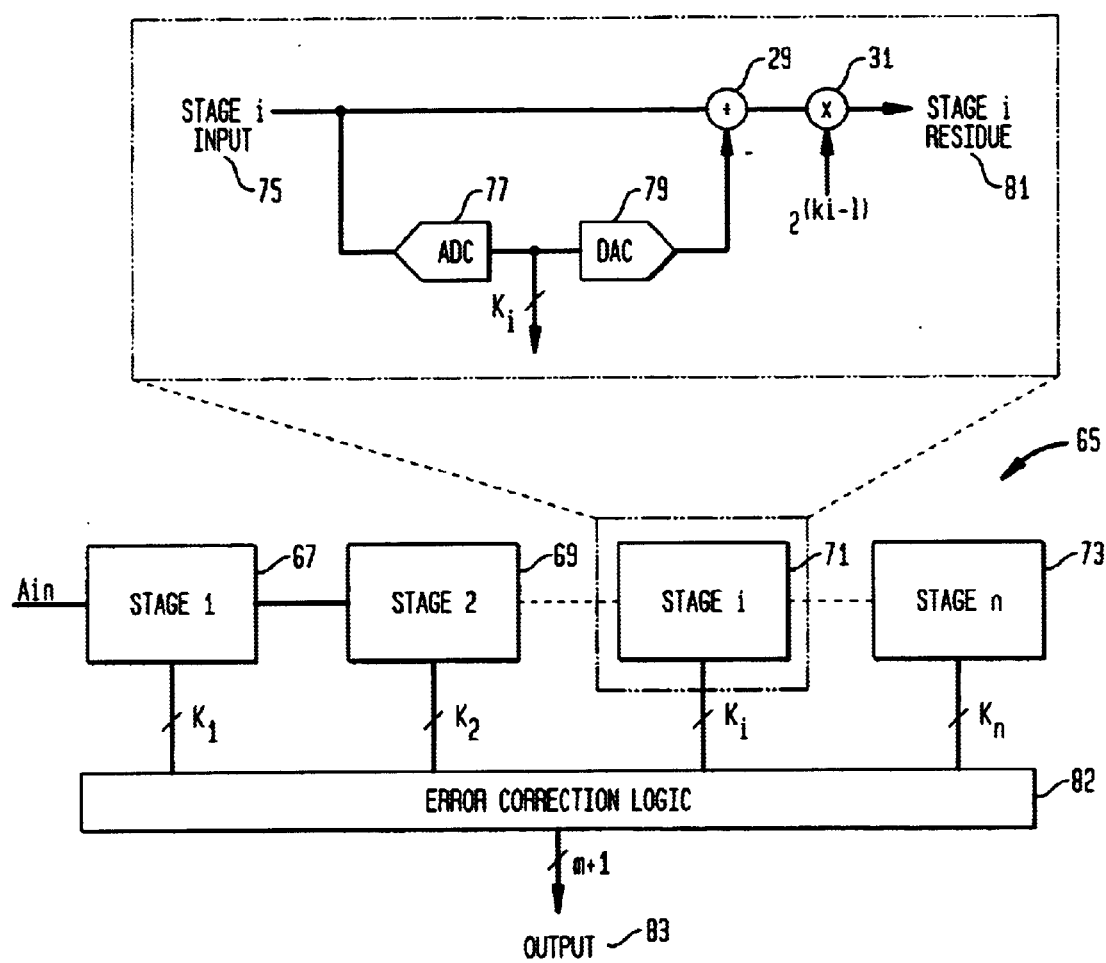
FIG. 19 is a block diagram of a pipelined ADC that corresponds to the residue plot of FIG. 18A.

FIG. 19 illustrates a pipelined ADC 65 that has been modified to be usable in an ADC constructed in accordance with the described embodiment. Pipelined ADC 65 operates according to the same principles as the pipelined ADC 13 described in connection with FIG. 3. However, sub-ADC 77, sub-DAC 79, and error correction logic 82 are modified so that pipelined ADC 65 generates residue segments outside of the nominal input range of the ADC. Pipelined ADC 65 of FIG. 3 comprises a first stage 67, a second stage 69, a final nth stage 73, and one or more intermediate stages, such as ith stage 71. First stage 67 accepts a sample of analog signal Ain as stage input 75. Then, as illustrated for ith stage 71, which generically illustrates the processing that occurs in each of stages 1 through n, stage input 75 is quantized to k bits by sub-ADC 77. These k bits are transmitted to error correction logic 82, which implements synchronization and correction functions. The bits are also transmitted to sub-digital-to-analog converter (DAC) 79, which converts the digital voltage into an analog voltage. The analog voltage is subtracted from stage input 75 by adder 29. The result of this operation is then multiplied by a factor of $2^{(ki-1)}$ by multiplier 31, where i is the stage number. The output of the multiplier 31 represents residue 81 of the stage, which is passed to the input of the next stage, if present, for further processing. After each stage has transmitted k bits to error correction logic 82, the error correction logic assembles and outputs m+1 bits as digital output 83.

Figure 20:
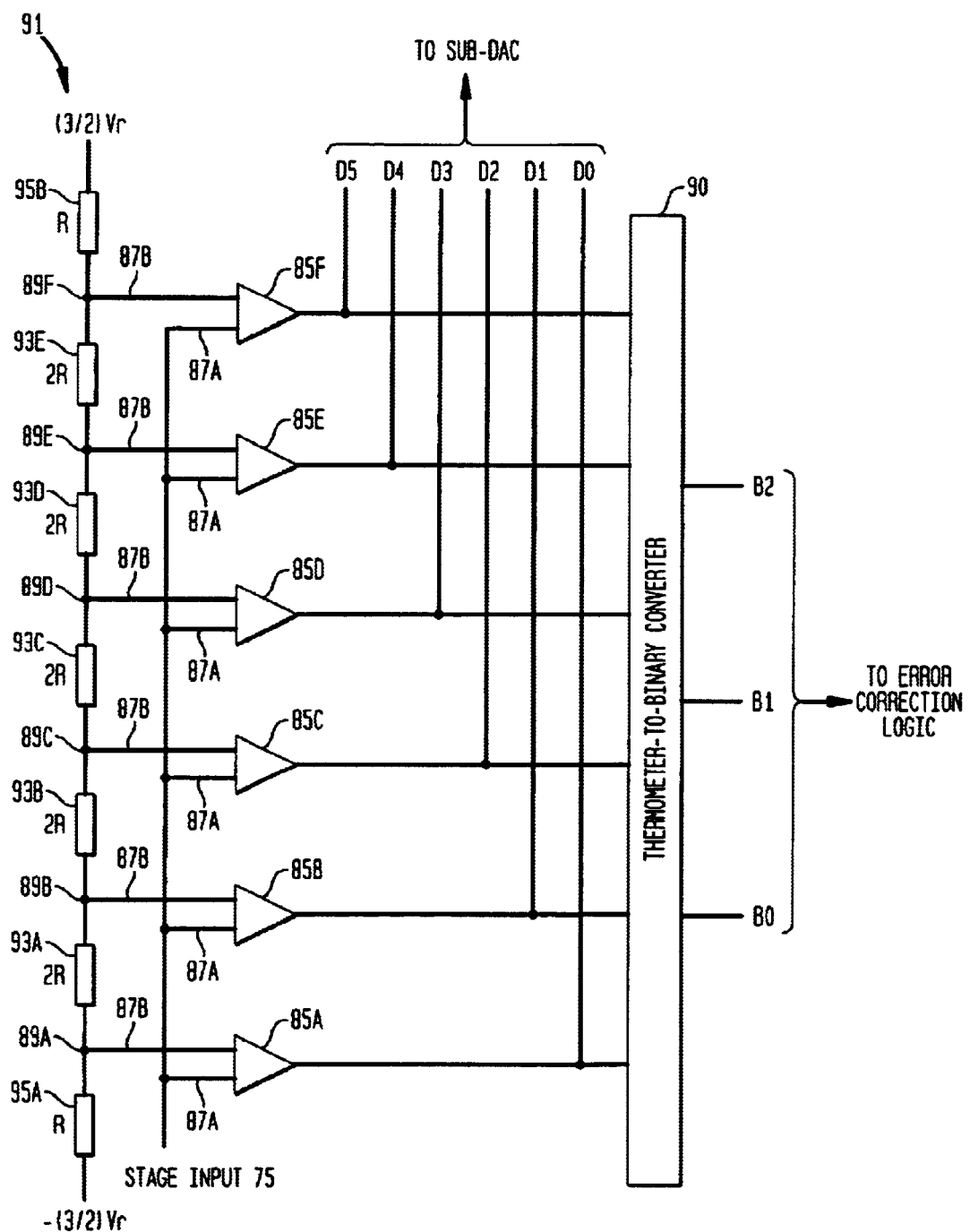
FIG. 20 is a schematic representation of a sub-ADC of the pipelined ADC of FIG. 19.

FIG. 20 illustrates one implementation of the sub-ADC 77 of FIG. 19. Sub-ADC 77 is constructed in a manner similar to sub-ADC 25 of FIG. 3, but includes two additional comparators and two additional resistors. As shown in FIG. 21, the six comparators 85A–F may output six different output codes. Each of comparators 85A–F comprises first and second input terminals 87A–B. The first input terminal 87A of each comparator 85A–F is coupled to stage input voltage 75. The second input terminal 87B of each comparator 85A–F is coupled to a node 89A–F on a string of resistors 91 coupled between two reference voltages −3/2Vr and 3/2Vr. As shown, resistors 93A–E have a resistance that is twice that of resistors 95A–B, although other implementations are possible.

Because the string of resistors 91 acts as a voltage divider, each node 89A–F on the string is at a different voltage level. Hence, each comparator 85A–F compares stage input voltage 75 with a different voltage level. A logic one is output by any comparator coupled to a node at a lower voltage than stage input voltage 75, and a logic zero is output by comparators coupled to a node at a higher voltage than stage input voltage 75. The voltage level to which stage input voltage 75 is compared is successively higher for comparators 85A, 85B, 85C, 85D, 85E, and 85F, respectively. Accordingly, comparator 85A outputs the least significant bit of the output code of sub-ADC 77, and comparator 85F outputs the most significant bit.

The output of comparators 85A–F is transmitted to sub-DAC 77 of FIG. 19 as bits D0–D5. The output is also transmitted to a thermometer-to-binary converter 90, which converts the thermometer code output of comparators 85A–F to binary code as bits B0–B2. The conversion is performed according to the thermometer-binary correspondences set forth in FIG. 22. The binary code output of sub-ADC 91 is transmitted to error correction logic 82 (FIG. 19).

Figure 23A:
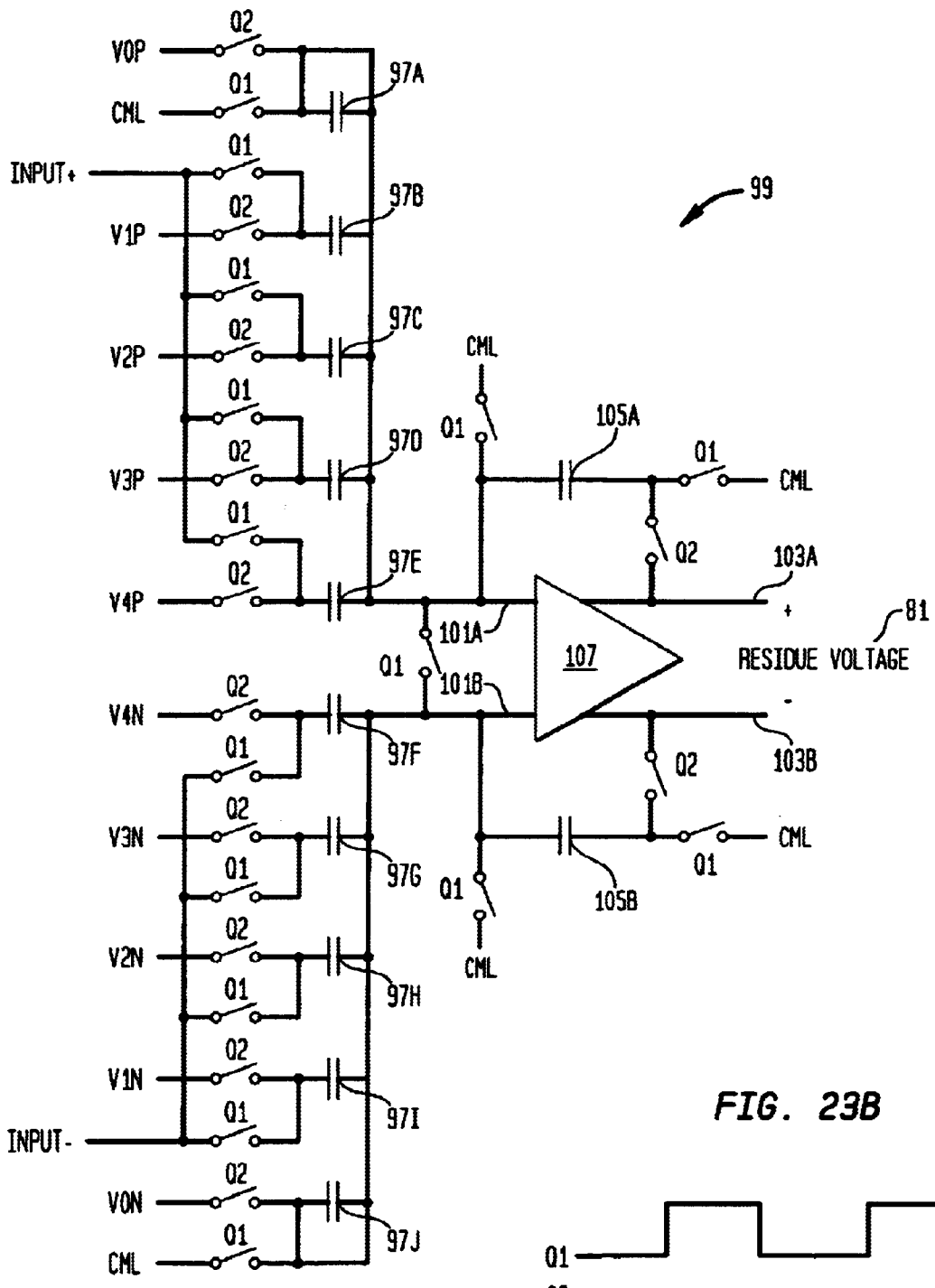
FIG. 23A is a schematic representation of a sub-DAC of the pipelined ADC of FIG. 19.
Figure 23B:
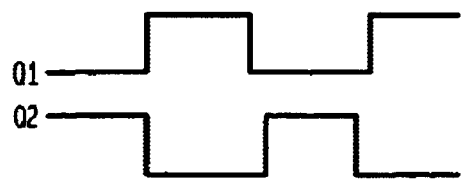
FIG. 23B shows voltage signals used in the activation of switches in the sub-DAC of FIG. 23A.

FIG. 23A illustrates one implementation of the sub-DAC 79, adder 29, and multiplier 31 of FIG. 19. In particular, FIG. 23A illustrates a block diagram of a multiplying digital-to-analog converter (MDAC) 99. MDAC 99 comprises inputs INPUT+ and INPUT− for receiving a stage input. MDAC 99 further comprises five pairs of input capacitors 97A–J. Four pairs, including input capacitors 97B–I, are connected via a switch Q1 to one of inputs INPUT+ or INPUT−. The fifth pair, including input capacitors 97A, J, is connected via a switch Q1 to common mode level voltage CML. The input capacitors 97A, J may have a capacitance that is twice that of input capacitors 97B–I. Each of input capacitors 97A–J is also connected to a reference voltage at a node V0P–V4N via a switch Q2. The reference voltage may be common mode level voltage CML, top reference voltage REFT, or bottom reference voltage bottom reference voltage REEB. Half of the input capacitors are connected to a first input terminal 101A of an operational amplifier 107, and half of the input capacitors are connected to a second input terminal 101B of operational amplifier 107. The first and second inputs are also connected to common mode level voltage CML, via switches Q1, and to first and second output terminals 103A–B of operational amplifier 107 via switches Q2 and output capacitors 105A–B. The first and second input terminals 101A–B of operational amplifier 107 are linked via a switch Q1.

MDAC 99 is activated in two phases: a sample phase and a hold phase. The sample phase, during which switches Q1 are closed, is illustrated in FIG. 24A. When switches Q1 are closed, four input capacitors 97B–E are connected in parallel between INPUT+ and common mode level voltage CML, and four input capacitors 97F–I are connected in parallel between INPUT− and common mode level voltage CML. Input capacitors 97A, J are each connected between common mode level voltage CML, which is coupled to both sides of each capacitor. Each of input capacitors 97A–J may have an equivalent capacitance. Because stage input 75 is applied between INPUT+ and INPUT−, input capacitors 97B–I are charged according to the magnitude of stage input 75. Input capacitors A, J, which are not connected between a voltage differential, are not charged.

After a time sufficient for input capacitors 97B–I to charge, switches Q1 are opened and switches Q2 are closed. In one example, switches Q2 may be closed after switches Q1 are opened. The hold phase, during which switches Q2 are closed, is illustrated in FIG. 24B. When switches Q2 are closed, each input capacitor 97A–J is connected to a reference voltage. The reference voltage may be common mode level voltage CML, top reference voltage REFT, or bottom reference voltage REFB, and is selected according to the digital output of the sub-ADC. FIG. 21 illustrates the voltage applied to each input capacitor 97A–J in FIG. 24B for each of seven possible output codes of the sub-ADC 83 of FIG. 20. As may be appreciated from the table, each pair of input capacitors 97A–J includes one capacitor coupled to top reference voltage REFT and one capacitor coupled to bottom reference voltage REFB. The difference between top reference voltage REFT and bottom reference voltage REFB is Vr. Hence, either +Vr or −Vr is applied to each pair of input capacitors 97A–J, according to the output code of sub-ADC 83. For example, if the output code of sub-ADC 83 is 000000, −Vr is applied to each pair, and if the output code of the sub-ADC is 111111, +Vr is applied to each pair. The coupling of top reference voltage REFT or bottom reference voltage REFB to input capacitors 97B–I alone produces the residue voltage of a conventional MDAC shown in FIG. 9A across outputs 103A–B.

For a digital input of 000000, which corresponds to a stage input voltage of less than $-Vr-Vr/2^k$, input capacitor 97A is switched to bottom reference voltage REFB and capacitor 97J is switched to REFT, which adds +Vr to the residue obtained using input capacitors 97B–I. For a digital input of 111111, which corresponds to a stage input voltage of greater than $Vr+Vr/2^k$, input capacitor 97A is switched to top reference voltage REFT and capacitor 97J is switched to bottom reference voltage REFB, which adds −Vr to the residue obtained using input capacitors 97B–I. For a digital input of 100000, 110000, 111000, 111100, or 111110, which correspond to a stage input voltage between $-Vr-Vr/2^k$ and $Vr+Vr/2^k$, both input capacitor 97A and input capacitor 97J are connected to CML, resulting in the same residue as for a conventional MDAC.

FIGS. 25A–C show one example of mapping that may occur in the error correction logic 82 of FIG. 19. FIG. 25A illustrates one example of an assignment of binary codes 159, output from sub-ADC 77, to the residue segments of the residue plot of FIG. 18A. Mapping algorithm 162 reassigns binary codes 159 to corrected binary codes 161. The mapping algorithm computes the reassignment by identifying regions of the residue plot of FIG. 25A where Aout is less than zero, and subtracting one from the corresponding binary code 159 of each identified region. The mapping that occurs via mapping algorithm 162 results in a transfer function for pipelined ADC 65 as shown in FIG. 25C. It should be appreciated that the mappings described above are given by way of example only, and that numerous alternative mappings are possible, and may be used in accordance with the invention.

It should be appreciated that sub-ADC 83 and sub-DAC 99, illustrated in FIGS. 20 and 23A, respectively may be modified so that additional residue segments are generated in the residue plot of FIG. 18A. In particular, sub-ADC 83 may be modified by adding an additional comparator 85 and resistor 93 for each additional residue segment, and sub-DAC 99 may be modified by adding an additional pair of capacitors 97 for each additional residue segment. Error correction logic 82 can then be modified to produce a unique output code for each additional residue segment in a similar manner to that discussed above in connection with FIG. 25A–C.

It should further be appreciated that the method of extending the input range of an ADC described above in connection with pipelined ADC 65 (FIG. 19) may be applied with other types of ADCs. In particular, the input range of an algorithmic ADC and/or a flash ADC may also be extended by assigning unique digital output codes that correspond to analog input voltages outside of the nominal input voltage range.

Having thus described several illustrative embodiments of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method of extending the input range of an analog-to-digital converter (ADC) having a nominal input voltage range, comprising an act of:

mapping an over-range input voltage that falls outside of the nominal input voltage range to an over-range digital output code.

2. The method of claim 1, further comprising an act of:

mapping a second over-range input voltage that falls outside of the nominal input voltage range to a second over-range digital output code.

3. The method of claim 1, wherein the ADC is a pipelined ADC having at least two stages and at least one k-bit stage, and further comprising an act of:

increasing the input range of the ADC by any multiple of the nominal input range multiplied by $1/[2^{(k-1)}]$.

4. The method of claim 1, wherein the ADC is an m-bit ADC, wherein the act of mapping further includes mapping the over-range input voltage to an m+1 bit over-range digital output code.

5. The method of claim 1, wherein the ADC is an m-bit ADC, and further comprises an act of:

mapping input voltages to $2^{m+1}$ digital output codes.

6. The method of claim 5, wherein the act of mapping the input voltages to $2^{m+1}$ digital output codes includes mapping the input voltages based on a transfer function in which digital output is not constant for analog inputs outside of the nominal input voltage range.

7. The method of claim 1, wherein the act of mapping includes mapping the over-range input voltage to an over-range digital output code that does not duplicate an output code corresponding to any voltages within the nominal input voltage range.

8. The method of claim 1, further comprising acts of:

inputting the over-range input voltage to the ADC;

converting the over-range input voltage to the over-range digital output code; and outputting the over-range digital output code from the ADC.

9. The method of claim 8, wherein the ADC is a pipelined ADC, and wherein:

the act of inputting includes inputting the over-range input voltage to a first stage of the pipelined ADC; and the act of converting includes inputting the over-range input voltage to a sub-ADC in the first stage that is adapted to generate a residue plot having a residue segment outside of the nominal input voltage range, and assigning the over-range digital output code to analog voltages within the residue segment, wherein the over-range input voltage falls within the residue segment.

10. An apparatus, comprising:

an analog-to-digital converter (ADC) having a nominal input voltage range, wherein the ADC is adapted to map an over-range input voltage that falls outside of the nominal input voltage range to an over-range digital output code.

11. The apparatus of claim 10, wherein the ADC is further adapted to map the over-range input voltage to an over-range digital output code that does not duplicate an output code corresponding to any voltage within the nominal input voltage range.

12. The apparatus of claim 10, wherein the ADC further comprises:

correction logic adapted to detect first input voltages above the nominal input voltage range and second input voltages below the nominal input range, wherein the correction logic is further adapted to map the first input voltages according to a first transfer function and map the second input voltages according to a second transfer function.

13. The apparatus of claim 10, wherein the ADC is an m-bit ADC, and wherein the ADC is adapted to map the over-range input voltage to an m+1 bit over-range digital output code.

14. The apparatus of claim 10, wherein the ADC is an m-bit ADC, and wherein the ADC is adapted to map input voltages to $2^{m+1}$ digital output codes.

15. The apparatus of claim 10, wherein the ADC is further adapted to map a second over-range input voltage that falls outside of the nominal input voltage range to a second over-range digital output code.

16. The apparatus of claim 10, wherein the ADC is a pipelined ADC, and wherein the pipelined ADC comprises:

a first stage comprising a sub-ADC adapted to generate a residue plot having a residue segment outside of the nominal input voltage range.

17. The apparatus of claim 16, wherein:

the over-range digital output code is assigned to analog voltages within the residue segment; and the over-range input voltage falls within the residue segment.

18. The apparatus of claim 10, wherein:

the ADC is a pipelined ADC and comprises:

a sub-digital-to-analog converter (DAC) including at least one capacitor arranged to sample a stage input voltage during a sample phase, and at least one additional capacitor arranged to sample a reference voltage during the sample phase;

wherein, after the sample phase, the additional capacitor is coupled to a first reference voltage when the input to the DAC is below the nominal input voltage range, to a second reference voltage when the input to the DAC is within the nominal input voltage range, and to a third reference voltage when the input to the DAC is above the nominal input range.

19. The apparatus of claim 18, wherein the pipelined ADC further comprises a sub-ADC comprising at least one comparator.

20. The apparatus of claim 10, wherein the ADC is a pipelined ADC having at least two stages and at least one k-bit stage, and wherein the ADC is adapted to have an input range approximately equal to any multiple of the nominal input range multiplied by $1/[2^{(k-1)}]$.

* * * * *